(12) United States Patent
Nagahara et al.

(10) Patent No.: US 6,444,255 B2
(45) Date of Patent: *Sep. 3, 2002

(54) METHOD FOR PRODUCING LIQUID CRYSTAL DISPLAY AND METHOD FOR CLEANING SUBSTRATE

(75) Inventors: Yoshiyuki Nagahara, Fukaya; Naoya Hayamizu; Naoaki Sakurai, both of Yokohama; Noriko Okoshi; Toshitaka Nonaka, both of Fukaya; Hiroaki Furuya, Hyogo-ken, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/781,399

(22) Filed: Feb. 13, 2001

Related U.S. Application Data

(62) Division of application No. 09/098,984, filed on Jun. 17, 1998, now Pat. No. 6,210,748.

(30) Foreign Application Priority Data

Jun. 17, 1997 (JP) ............................................. 9-159616
Aug. 8, 1997 (JP) ............................................. 9-214557
May 18, 1998 (JP) ........................................... 10-135698

(51) Int. Cl.$^7$ ................................................. B05D 5/12
(52) U.S. Cl. ...................... 427/108; 427/164; 427/307; 427/600; 349/123; 134/1.3; 134/2; 134/6; 134/33
(58) Field of Search ................................. 427/108, 164, 427/307, 600; 349/723; 134/1.3, 2, 6, 33

(56) References Cited

U.S. PATENT DOCUMENTS 5,676,760 A * 10/1997 Aoki et al. .................. 134/1.3
6,210,748 B1 * 4/2001 Nagahara et al. ........... 427/108

* cited by examiner

*Primary Examiner*—B K Talbot
(74) *Attorney, Agent, or Firm*—Oblon, Spivak, McClelland, Maier & Neustadt, P.C.

(57) ABSTRACT

An electrode substrate is brush cleaned with a hydrogen gas dissolved water, which has an oxidation-reduction potential of −860 mV to −400 mV and a pH of 8 to 12, before applying an alignment layer material on the electrode substrate. Thus, it is possible to decrease the manufacturing costs without decreasing the detergency.

5 Claims, 19 Drawing Sheets

| | A: HYDROGEN GAS DISSOLVED WATER CONTAINING AMMONIA (CATHODE WATER) | B: HYDROGEN GAS DISSOLVED WATER CONTAINING AMMONIA |
|---|---|---|
| PRODUCING METHOD | WATER ELECTROLYSIS METHOD | GAS DISSOLVING METHOD |
| OXYGEN CONCENTRATION (ppm) | 0.14 | ≦0.60 |
| HYDROGEN CONCENTRATION (ppm) | 1.15 | 1.20 |
| NITROGEN CONCENTRATION (ppm) | ≦6.5 | ≦2.8 |
| OZONE CONCENTRATION (ppm) | 0 | 0 |
| ORP (mV) | −800 | −860 |
| pH | 10.2 | 10.2 |
| TEMPERATURE (°C) | 23.0 | 23.0 |
| AMOUNT OF ADDED CHEMICALS | AMMONIA 2 mmol | AMMONIA 2 mmol |

FIG. 16

METHOD FOR PRODUCING LIQUID CRYSTAL DISPLAY AND METHOD FOR CLEANING SUBSTRATE

This application is a division of application Ser. No. 09/098,984, filed Jun. 17, 1998, now U.S. Pat. No. 6,210,748.

BACKGROUND OF THE INVENTION

1. Field of the Invention

The present invention relates generally to a method for producing a liquid crystal display and a method for cleaning a substrate.

2. Description of the Prior Art

Liquid crystal displays are thin and light and have low electric power consumption so as to be widely used for note-type and subnote-type personal computers. With the improvement of performance of personal computers, it has been required to increase the display capacity and display area of such liquid crystal displays and to improve the picture quality thereof. With the requirement of the improvement of picture quality, the deterioration of picture quality has been caused by slight scratch defects and chrominance non-uniformity produced during the manufacturing process. In order to prevent the occurrence of such scratch defects and chrominance non-uniformity, fine contaminations (particles) as well as organic films adhered to substrates must be removed in cleaning steps which are carried out as pretreatment steps in respective processes.

Referring to FIGS. 8 and 9, a conventional cleaning step for use in a method for producing a liquid crystal display will be described blow.

FIG. 8 shows a step of cleaning a substrate before forming an alignment layer, and FIG. 9 shows a step of cleaning a substrate after forming an alignment layer. When the substrate is e.g., an array substrate, i.e., a transparent substrate on which a plurality of scanning lines intersect a plurality of signal lines and wherein thin film transistors (each of which will be hereinafter referred to as a "TFT") serving as switching elements are arranged on the respective intersecting portions, some of the TFTs being connected to pixel electrodes, the term "substrate before forming the alignment layer" means a substrate on which pixel elements are formed. When the substrate is a counter substrate facing the array substrate, e.g., a color filter substrate (which will be also hereinafter referred to as a "CF substrate"), i.e., a transparent substrate, on which grid-like shading films of a black organic resin are arranged and a plurality of colors of colored layers of red, blue and green are arranged in the form of stripes so as to fill in the spaces between the grid and wherein a common electrode of ITO (indium tin oxide) is formed on the whole surface of the colored layers, the term "substrate before forming the alignment layer" means a substrate on which at least a common electrode is formed.

Referring to FIG. 8 again, a step of cleaning a substrate before forming an alignment layer will be described. First, such a substrate 2 is fed to a brush cleaning unit 120 by means of transfer rollers 111. Then, a cleaning solution is sprayed on the substrate 2 from nozzles 125. This cleaning solution is prepared by mixing a surface active agent with a pure water so as to have a predetermined concentration. The cleaning solution is prepared in a mixing tank 110 and pumped out by means of a pump 115 to be supplied to the nozzles 125.

The surface of the substrate 2, on which the cleaning solution has been sprayed, is rubbed by brushes 123, so that relatively large contaminations (particles) are removed from the substrate 2 to clean the substrate 2. Therefore, the waste water discharged from the brush cleaning unit 120 contains a surface active agent of high concentration.

Then, the substrate 2, which has been cleaned by the brushes 123, is fed to a pure water jet unit 130 by means of transfer rollers 111. Then, a high pressure pure water is sprayed on the substrate 2 from jet nozzles 135. Thus, the surface active agent on the substrate 2 is replaced with a pure water, and particles are removed by the high pressure pure water. Furthermore, the high pressure pure water is pumped out of a pure water storage tank (not shown) by means of a high pressure pump 133 to be supplied to the jet nozzles 135, and jetted from the jet nozzles 135 as a jet flow.

Then, the substrate 2 is fed to a shower unit 140 by means of transfer rollers 111. Then, a pure water is sprayed on the substrate 2 from shower nozzles 143 to wash the surface active agent and the water treated in the jet unit 130 (the water containing a surface active agent of intermediate concentration). Therefore, the waste water discharged from the shower unit 140 contains a surface active agent of low concentration.

Then, the substrate 2 is fed to an ultrasonic cleaning unit 150 by means of transfer rollers 111. A pure water, to which an ultrasonic vibrational energy is applied, is jetted out of an ultrasonic nozzle 154 driven by an oscillator 153 to be sprayed on the substrate 2. Thus, the relatively fine particles adhered to the substrate 2 are removed, and the water used in the shower unit 140 is washed out. Thereafter, the substrate 2 is fed to a shower unit 160 by means of transfer rollers 111, and a pure water is sprayed on the substrate 2 from shower nozzles 163, so that the water used for the cleaning in the ultrasonic cleaning unit 150 is washed out. Furthermore, the waste waters discharged from the ultrasonic cleaning unit 150 and the shower unit 160 can be treated as usual waste waters since the concentrations of the surface active agents contained in the waste wafers are very low.

Then, the substrate 2 is fed to a draining unit 170 by means of transfer rollers 111, and the water adhered to the surface of the substrate 2 is removed by air knives 172. Thereafter, the substrate 2 thus drained is transported to a hot plate 180 to be dried thereon.

Then, an alignment layer material is applied on the substrate 2 thus dried, and the rubbing thereon is carried out to form an alignment layer thereon. Referring to FIG. 9, a step of cleaning the substrate 2, on which the alignment layer has been formed, will be described. First, the substrate 2 is mounted in a bath 224 of an ultrasonic cleaning unit 220 by means of a loader (not shown). To this bath 224, a cleaning solution is supplied from a mixing tank 210 via a pump 215. This cleaning solution is prepared in the mixing tank 210 so as to contain a predetermined concentration of surface active agent. To the lower portion of the bath 224, an ultrasonic vibrational energy is applied by means of an oscillator 223. Therefore, the ultrasonic vibrational energy is applied to the substrate 2 in the cleaning solution to clean the substrate 2.

Then, the substrate 2 is fed to a pure water jet unit 230 by means of transfer rollers 211. Then, a high-pressure pure water is sprayed on the substrate 2 from jet nozzles 235 to replace the surface active agent with a pure water and to remove the particles on the substrate 2. The pure water is pumped out of a pure water storage tank (not shown) to be supplied to the jet nozzles 235. Furthermore, although the waste water discharged from the ultrasonic cleaning unit 220 contains a surface active agent of high concentration, and the waste water discharged from the pure water jet unit 230 contains a surface active agent of intermediate concentration.

Then, the substrate 2 is fed to a shower unit 240 by means of transfer rollers 211, and a pure water is sprayed on the substrate 2 from shower nozzles 243. Thus, the surface active agent and the water used in the jet unit 230 are washed out. The waste water discharged from the shower unit 240 contains a surface active agent of low concentration.

Then, the substrate 2 is fed to an ultrasonic cleaning unit 250 by means of transfer rollers 211. Then, a pure water, to which an ultrasonic vibrational energy has been applied, is jetted out of an ultrasonic nozzle 254 driven by an oscillator 253 to be sprayed on the substrate 2. Thus, the relatively fine particles adhered to the substrate 2 are removed, and the water used in the shower unit 240 is washed out.

Thereafter, the substrate 2 is fed to a shower unit 260 by means of transfer rollers 211. Then, a pure water is sprayed on the substrate 2 from shower nozzles 263, and the water used for the cleaning in the ultrasonic cleaning unit 250. Furthermore, the waste waters discharged from the ultrasonic cleaning unit 250 and the shower unit 260 can be treated as non-industrial waters since these waters contain a surface active agent of very low concentration.

Then, the substrate 2 is transported to a spin dry unit 270 to be fixed to a spin table 274. Since the spin table 274 is rotated by a motor 272, the substrate 2 is also rotated with the spin table 274, so that the water adhered to the surface of the substrate 2 is drained. Thereafter, the substrate 2 is transported to a hot plate 280 to be dried thereon.

As described above, in the conventional method for producing a liquid crystal display, the surface active agents are used as the cleaning solutions. These surface active agents are harmful to the natural world, and the waste waters discharged from the respective units contain different concentrations of surface active agents, so that it is required to separately recover and discharge the waste waters from the respective units. In addition, it is difficult to replace the surface active agents with water, and when the surface active agents remain on the substrate, the surface active agents form chrominance non-uniformity thereon to deteriorate the display quality, so that a great amount of pure water is required to rinse the substrate and it takes a lot of time for the rinsing. Therefore, there is a problem in that the manufacturing costs are increased.

Moreover, the cleaning solution containing the surface active agent must be diluted with a pure water so as to have a predetermined concentration in order to obtain a good detergency, and the temperature thereof must be adjusted so as to have a predetermined temperature, so that the there are problems in that the size of the system is increased and the manufacturing costs are increased.

SUMMARY OF THE INVENTION

It is therefore an object of the present invention to eliminate the aforementioned problems and to provide a method for producing a liquid crystal display, which can prevent the manufacturing costs from increasing without decreasing the detergency.

In order to accomplish the aforementioned and other objects, according to one aspect of the present invention, there is provided a method for producing a liquid crystal display, the method comprising a step of brush cleaning an electrode substrate with a hydrogen gas dissolved water, which has an oxidation-reduction potential of −860 mV to −400 mV and a pH of 8 to 12, before applying an alignment layer material on the electrode substrate.

According to another aspect of the present invention, there is provided a method for cleaning a substrate, the method comprising a step of ultrasonic cleaning a substrate with a hydrogen gas dissolved water, which has a dissolved hydrogen gas concentration of 0.5 ppm to 2 ppm.

According to the liquid crystal display producing method and the substrate cleaning method, since the hydrogen gas dissolved water (the water in which hydrogen gas dissolves) is used to clean the substrate, it is not required to carry out a special waste water treatment unlike the conventional method using the surface active agents, so that it is possible to prevent the manufacturing costs from increasing. In addition, the hydrogen gas dissolved water is difficult to remain on the surface of the substrate, and the hydrogen gas dissolved water is just water even if it remains thereon. Therefore, the amount of the pure water for use in the rinsing after cleaning and the rinsing time can be smaller than those in the conventional method, so that it is possible to prevent the manufacturing costs from increasing. In addition, it was found from the results of experiment that if a hydrogen gas dissolved water having a proper oxidation-reduction potential is used, the detergency can be the same as or better than the conventional detergency.

Furthermore, the brush cleaning is effective in the removal of relatively large particles, and the ultrasonic cleaning is effective in the removal of relatively small particles.

When the electrode substrate is brush cleaned with a hydrogen gas dissolved water, the oxidation-reduction potential of the hydrogen gas dissolved water may be in the range of from −860 mV to −400 mV, and the pH thereof may be in the range of from 8 to 12. When the oxidation-reduction potential of the hydrogen gas dissolved water is minus and when the absolute value thereof is great, it is possible to prevent the metal corrosion. In addition, when the pH is equal to or greater than 8, it is possible to prevent the particles (contaminations), which have been removed by the brush, from being adhered to the substrate again. Moreover, when the pH is equal to or smaller than 12, it is possible to prevent the metal electrode from melting.

It was also found from the results of experiment that when the ultrasonic cleaning is carried out using a hydrogen gas dissolved water, if the hydrogen gas dissolved water has a dissolved hydrogen concentration of not less than 0.5 ppm, the cleaning effect is great. The solubility of hydrogen gas is about 2 ppm at atmospheric pressure, and the concentration of dissolved hydrogen can be increased by pressurization or the like.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 16 is a table showing the characteristics of hydrogen gas dissolved waters produced by the water electrolysis method and the gas dissolving method;

DESCRIPTION OF THE PREFERRED EMBODIMENTS

Figure 23:
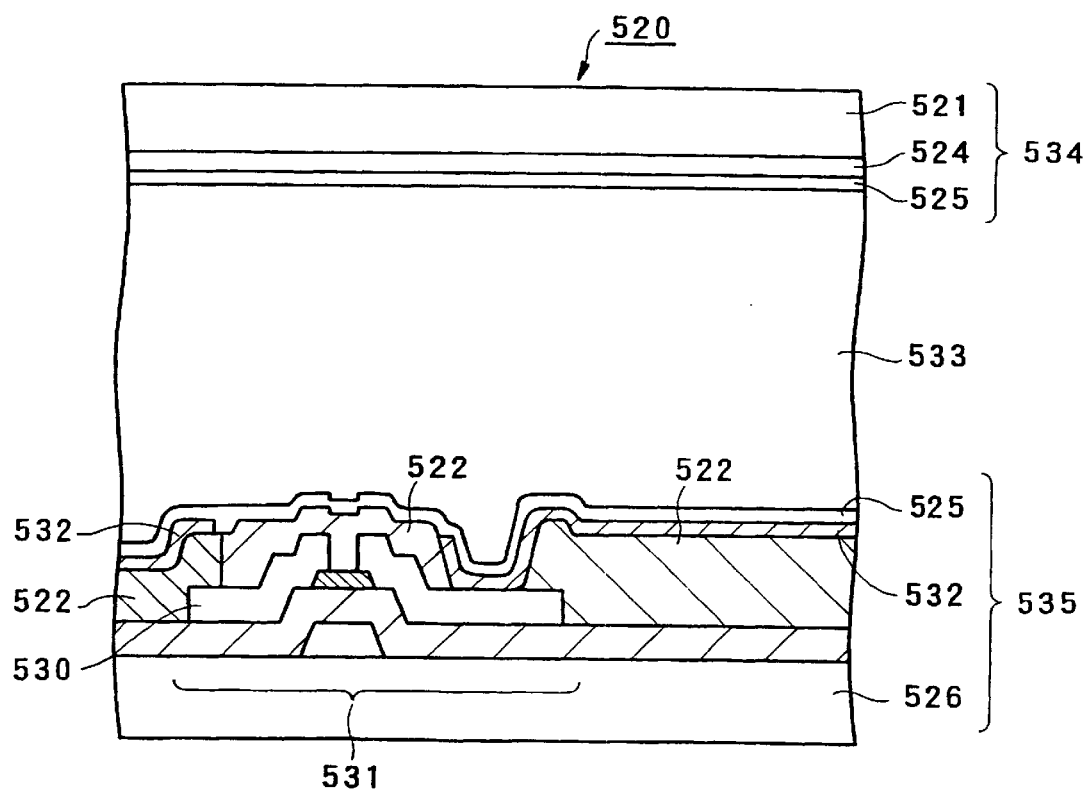
FIG. 23 is a schematic sectional view of a liquid crystal display.

Before describing the preferred embodiments according to the present invention, a liquid crystal display will be described. As shown in FIG. 23, a liquid crystal display 520 comprises a liquid crystal layer 533 sandwiched between a counter substrate 534 and an array substrate 535. The counter substrate 534 comprises: a glass substrate 521; a common electrode 524 stacked on the colored layers 522; and an alignment layer 525 stacked thereon. The array substrate 535 comprises: a substrate 526; a plurality of signal lines 530 and a plurality of scanning lines (not shown), which are arranged on the substrate 526 so as to intersect each other; switching elements 531 arranged on the respective intersecting portions; colored layers 522 of three colors, i.e., red, green and blue, which are arranged so as to cover the whole surface; pixel electrodes 532 arranged on the colored layers 522 to be connected to the switching elements 531; and an alignment layer 525 arranged so as to cover these elements. After the substrates 534 and 535 are adhered to each other, a liquid crystal is enclosed, so that the production of a liquid crystal display is completed.

Figure 1:
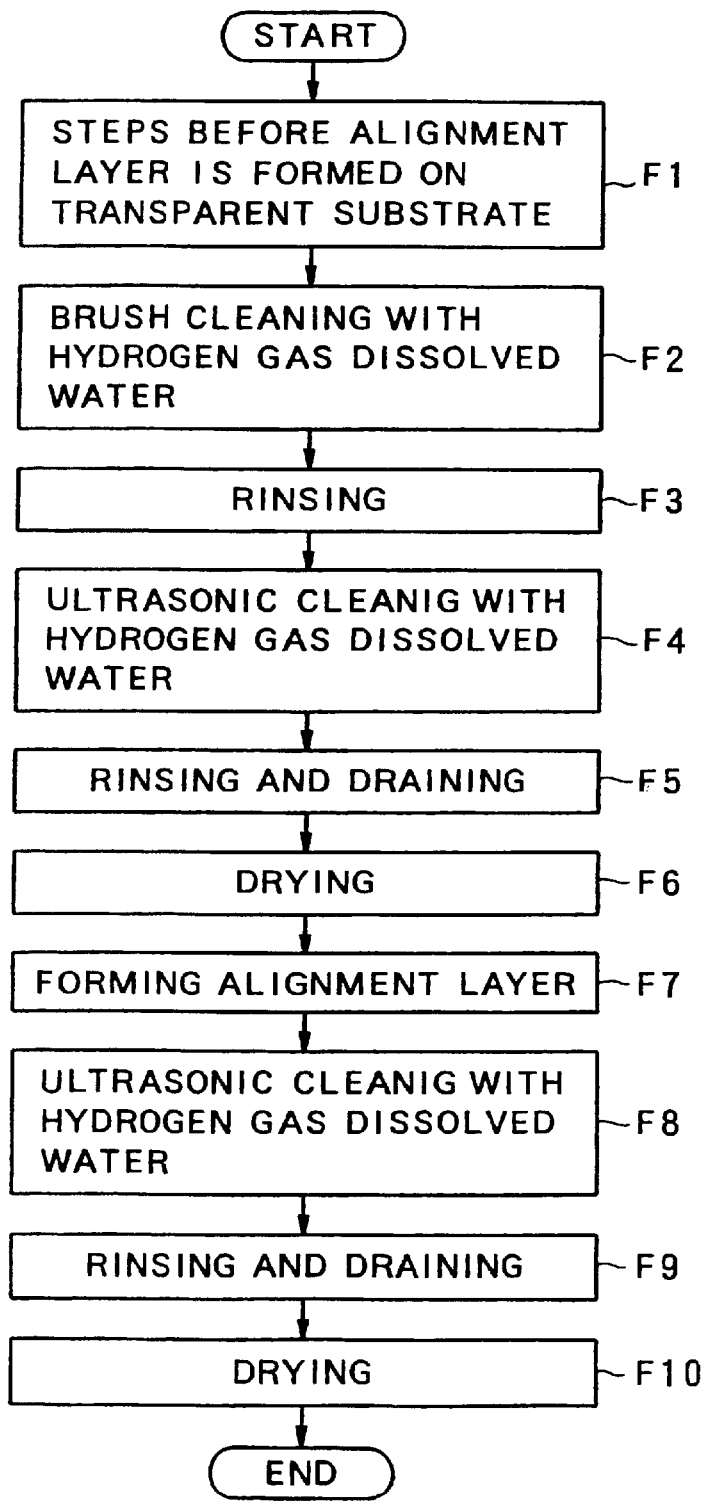
FIG. 1 is a flow chart showing the producing steps in the preferred embodiment of a method for producing a liquid crystal display according to the present invention.

Referring to FIGS. 1 through 6, the first preferred embodiment of a method for producing a liquid crystal display according to the present invention will be described below. FIG. 1 shows the steps of the first preferred embodiment of a method for producing a liquid crystal display according to the present invention.

First, as shown at step F1 in FIG. 1, the steps before forming an alignment layer on a transparent substrate are carried out. When the substrate is an array substrate, the steps until forming pixel electrodes are carried out, and when the substrate is a counter substrate, the steps until forming a counter electrode are carried out. Each of the array substrate and the counter substrate, on which the electrode is thus formed, will be also hereinafter referred to as an "electrode substrate".

The steps until forming pixel electrodes are as follows.

An alloy of Mo and W serving as a metal for gate electrodes and scanning lines is formed on a transparent substrate so as to have a predetermined thickness by the sputtering. After a photoresist is applied on the alloy, the patterning is carried out by the photo process so that the photoresist remains in portions, in which scanning lines and gate electrodes are to be formed. Subsequently, a portion, from which the photoresist has been removed, i.e., in which the alloy of Mo and W is exposed, is removed by the etching to form scanning lines and gate electrodes. Then, a silicon oxide is formed as an insulating film. Subsequently, amorphous silicon is patterned as a semiconductor element to form an active element portion. Subsequently, a Mo film is formed on the whole surface by the sputtering, and then, an alloy film of Al and Nd is formed on the whole surface by the sputtering. Thereafter, the patterning is carried out by the photolithography and etching methods to form signal lines, drain electrodes and source electrodes so as to form thin film transistors. Colored layers of three colors, i.e., red, green and blue, which are made of an organic resin, are arranged in the form of stripes. These colored layers forms a color filter. Each of the colored layers has a through hole for connecting a pixel electrode to a thin film transistor, which will be formed at a subsequent step. Subsequently, the source electrodes are connected to form a pixel electrode of ITO on the colored layers for each of the film transistors, to complete the production of an array substrate.

Thus, the substrate, for which the steps before forming an alignment layer have been carried out, is brush cleaned with a hydrogen gas dissolved water that hydrogen gas dissolves in water, and then, the substrate is rinsed (see steps F2, F3 in FIG. 1). The brush cleaning and the rinsing are carried out in, e.g., a brush cleaning unit 20 and a shower unit 30 shown in FIG. 2, to remove relatively large particles.

Figure 2:
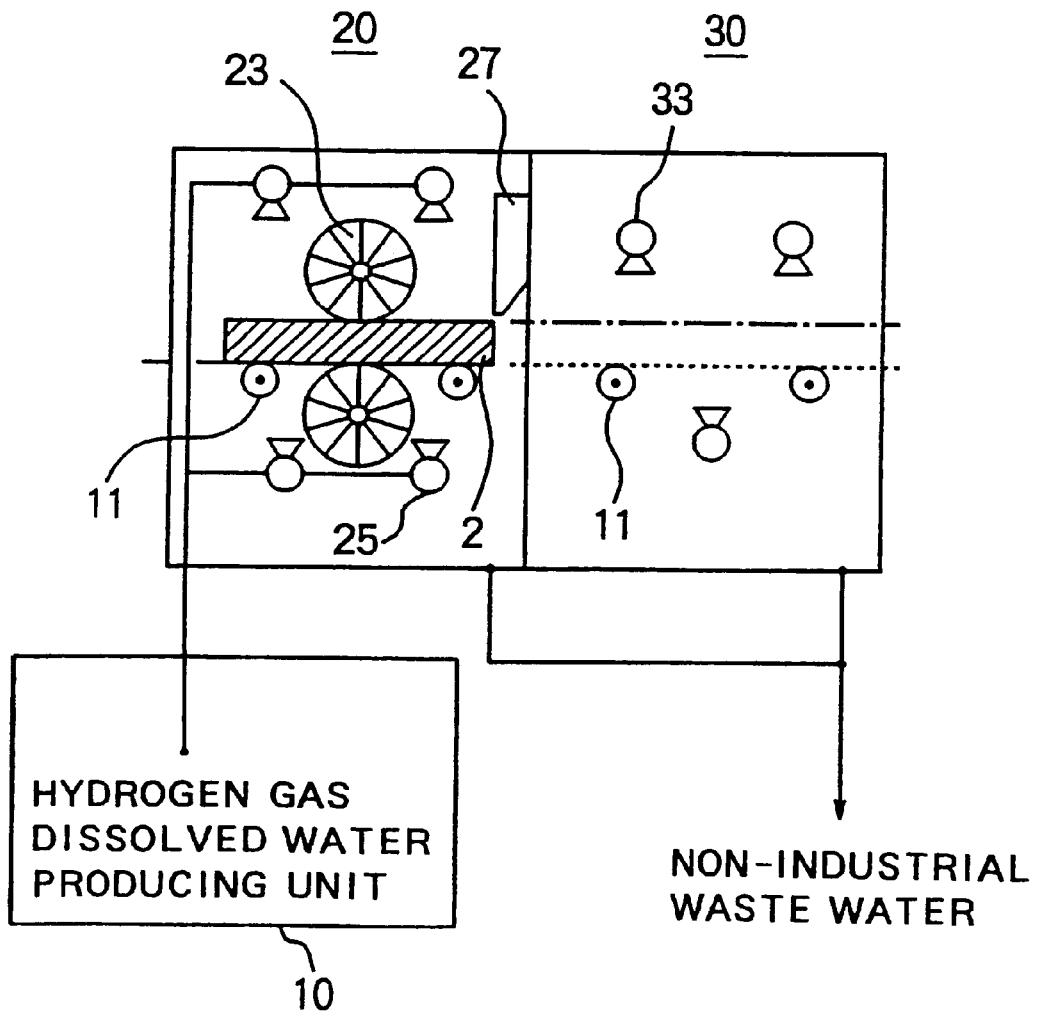
FIG. 2 is a schematic view for explaining a brush cleaning step in the preferred embodiment of a method for producing a liquid crystal display according to the present invention.

As shown in FIG. 2, when a substrate 2 is carried in a brush cleaning unit 20, a hydrogen gas dissolved water supplied from a hydrogen gas dissolved water producing unit 10 is sprayed on the substrate 2 from nozzles 25. The surface of the substrate 2, on which the hydrogen gas dissolved water has been sprayed, is rubbed with brushes 23 to be cleaned. The substrate 2, which has been brush cleaned, is fed to a shower unit 30 by means of transfer rollers 11. Then, a pure water is sprayed on the substrate 2 from shower nozzles 33 to rinse the substrate 2.

In general, the hydrogen gas dissolved water is selected from:
(a) a hydrogen gas dissolved water produced by a gas dissolving method, which will be described later;
(b) a cathode water obtained by electrolyzing water;
(c) a hydrogen gas dissolved water obtained by adding an alkaline material (e.g., $NH_4OH$) to a cathode water obtained by electrolyzing water;
(d) a cathode water obtained by electrolyzing a pure water containing a supporting electrolyte (e.g., $NH_4OH$);
(e) a hydrogen gas dissolved water (a) containing an alkaline material.

In this preferred embodiment, the cathode water (d) is used as the hydrogen gas dissolved water.

For example, the hydrogen gas dissolved water for use in this preferred embodiment is produced by electrolysis as follows.

First, a tank containing a pure water is divided by a porous membrane into two regions. A cathode is provided in one of the tow regions of the tank, and an anode is provided in the other region of the tank. A dc voltage is applied to these electrodes. In this preferred embodiment, the pure water contains a supporting electrolyte in order to enhance the electrolysis efficiency. When the electrolysis is started, the cathode attracts $H^+$ ions, which receive electrons from the cathode to be $H_2$ gas to be discharged. Therefore, near the cathode, the number of $H^+$ ions decreases and $OH^-$ ions remain, so that the water near the cathode (a cathode water) is alkaline. Similarly, the anode attracts $OH^-$ ions, from which electrons are received by the anode to produce $O_2$ gas to be discharged. Therefore, the water near the anode (an anode water) is acidic since the number of $OH^-$ ions decreases and $H^+$ ions remain.

In general, the cathode water produced by electrolysis has a pH different from that of water, and a higher oxidation-reduction potential (which will be hereinafter referred to as "ORP") than those of usual chemicals. This ORP value can be controlled by changing the amount of the added supporting electrolyte.

The hydrogen gas dissolved water, which was used for the brush cleaning in this preferred embodiment, was a cathode water, which contained a $2 \times 10^{-3}$ mol/liter of ammonia as a supporting electrolyte and which had an ORP of about −800 mV and a pH of about 10.5.

Furthermore, the value of pH is measured at the discharge port, and the value of ORP is measured by means of a normal hydrogen electrode.

Assuming that the residual rate of particles on the surface of the substrate is 1 when the brush cleaning is carried out using surface active agents as conventional methods, the residual rate of particles on the surface of the substrate was about 0.3 when the brush cleaning was carried out using the hydrogen gas dissolved water. Therefore, it is possible to obtain a very good detergency in comparison with the conventional methods.

In addition, since the pH is about 10.5, the hydrogen gas dissolved water after the brush cleaning can be discharged as a non-industrial water without the need of any special treatments.

Referring to FIG. 1 again, the substrate, which has been brush cleaned and rinsed, is cleaned with a hydrogen gas dissolved water, to which an ultrasonic energy has been applied (see step F4 in FIG. 1). Then, after rinsing and draining the substrate (see step F5 in FIG. 1), the substrate is dried (see step F6 in FIG. 1).

This ultrasonic cleaning step is carried out to remove relatively small particles. The cleaning, rinsing and draining can be carried out by means of, e.g., a spin cup unit 41. The ultrasonic cleaning step using the spin cup unit 41 will be described below.

Figure 3:
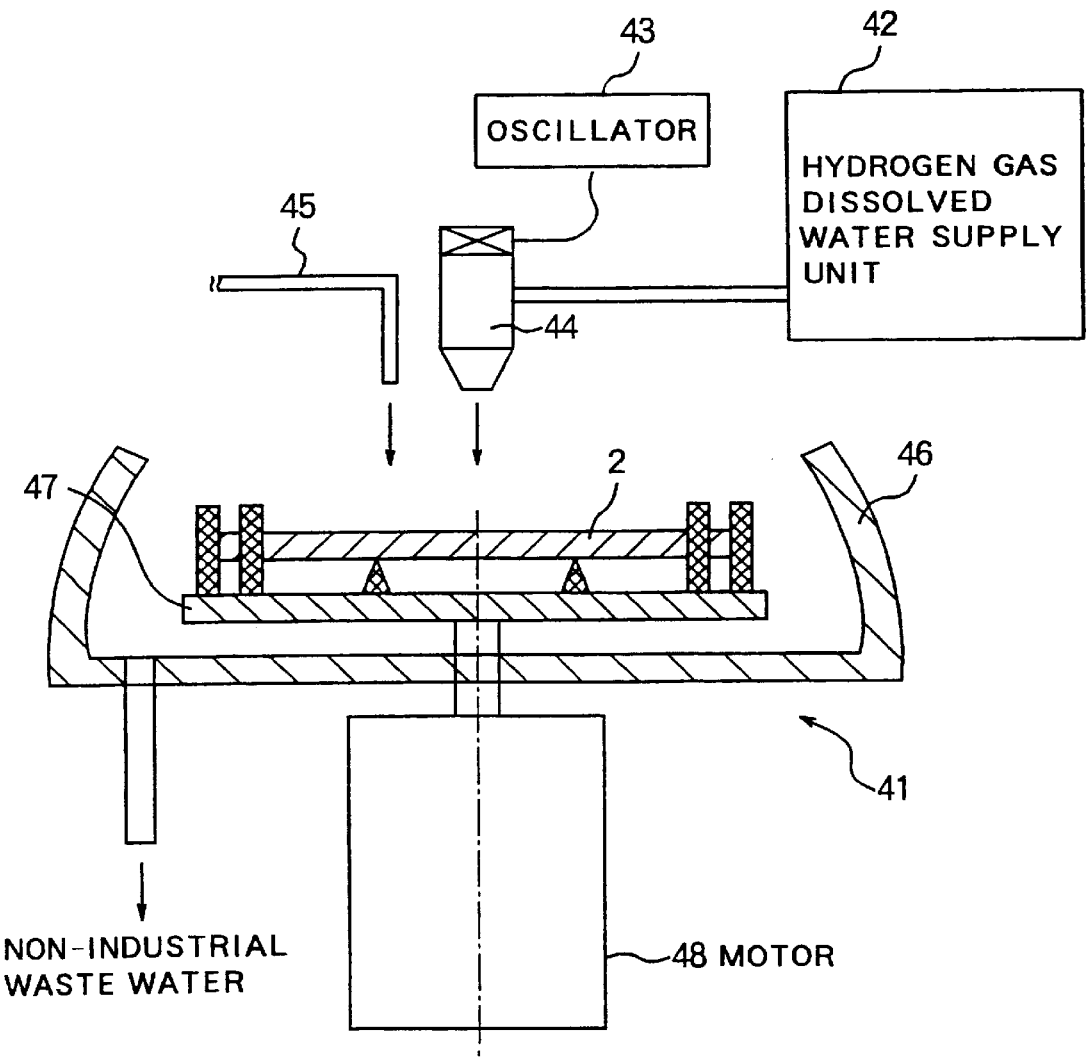
FIG. 3 is a schematic view for explaining an ultrasonic cleaning step in the preferred embodiment of a method for a liquid crystal display according to the present invention.

The substrate 2 is mounted on a spin table 47 in a spin cup 46 by means of a loader (not shown) to be fixed thereto (see FIG. 3). The spin table 47 is rotated by a motor 48, so that the substrate 2 fixed to the spin table 47 is also rotated. On the upper surface of the rotating substrate 2, a hydrogen gas dissolved water, to which an ultrasonic energy has been applied, is sprayed from an ultrasonic nozzle 44. When the hydrogen gas dissolved water is supplied from a hydrogen gas dissolved water supply unit 42 to the ultrasonic nozzle 44 and when the ultrasonic nozzle 44 is driven by an oscillator 43, an ultrasonic energy is applied to the hydrogen gas dissolved water.

Furthermore, since the ultrasonic nozzle 44 is movable from the rotation center in a radial direction of gyration along the surface of the substrate 2, it is possible to uniformly clean the surface of the substrate 2. When the ultrasonic cleaning step is completed, the supply of the hydrogen gas dissolved water is stopped, and a pure water is sprayed on the rotating substrate 2 from a nozzle 45 to rinse the substrate 2. Thereafter, the supply of the pure water is stopped, and the spin table 47 is rotated at a high speed to drain the substrate 2. After the draining is stopped, the substrate 2 is removed from the spin cup unit 41 to be transported to a hot plate (not shown) to be dried thereon.

In this preferred embodiment, while the hydrogen gas dissolved water used at the ultrasonic cleaning step has been the same hydrogen gas dissolved water as that used at the brush cleaning step, i.e., the hydrogen gas dissolved water having the same ORP value as that used at the brush cleaning step, the hydrogen gas dissolved water used at the ultrasonic cleaning step may have an ORP value different from that used at the brush cleaning step.

It was found that when the hydrogen gas dissolved waters were used at the ultrasonic cleaning and rinsing steps as this preferred embodiment, the residual rate of particles on the surface of the substrate was smaller than that in the conventional method.

After the ultrasonic cleaning step, the rinsing and draining step and the drying step are completed, an alignment layer is formed on the substrate (see step F7 in FIG. 1). That is, an alignment layer of, e.g., a polyimide, is applied on the surface of the substrate, on which the electrode has been formed, and the substrate is dried to form a polyimide film thereon. Then, the rubbing of the polyimide film is carried out to form an alignment layer.

Then, the substrate, on which the alignment layer has formed, is cleaned by means of a hydrogen gas dissolved water, to which an ultrasonic energy has been applied (see step F8 in FIG. 1). After the rinsing and draining of the substrate are carried out (see step F9 in FIG. 1), the substrate is dried (see step F10 in FIG. 1). These ultrasonic cleaning, rinsing and draining steps can be carried out by means of, e.g., the spin cup unit 41 shown in FIG. 3, to remove relatively small particles. Referring to FIGS. 3 and 10 through 13, the ultrasonic cleaning step using the spin cup unit 41 will be described below.

Figure 10:
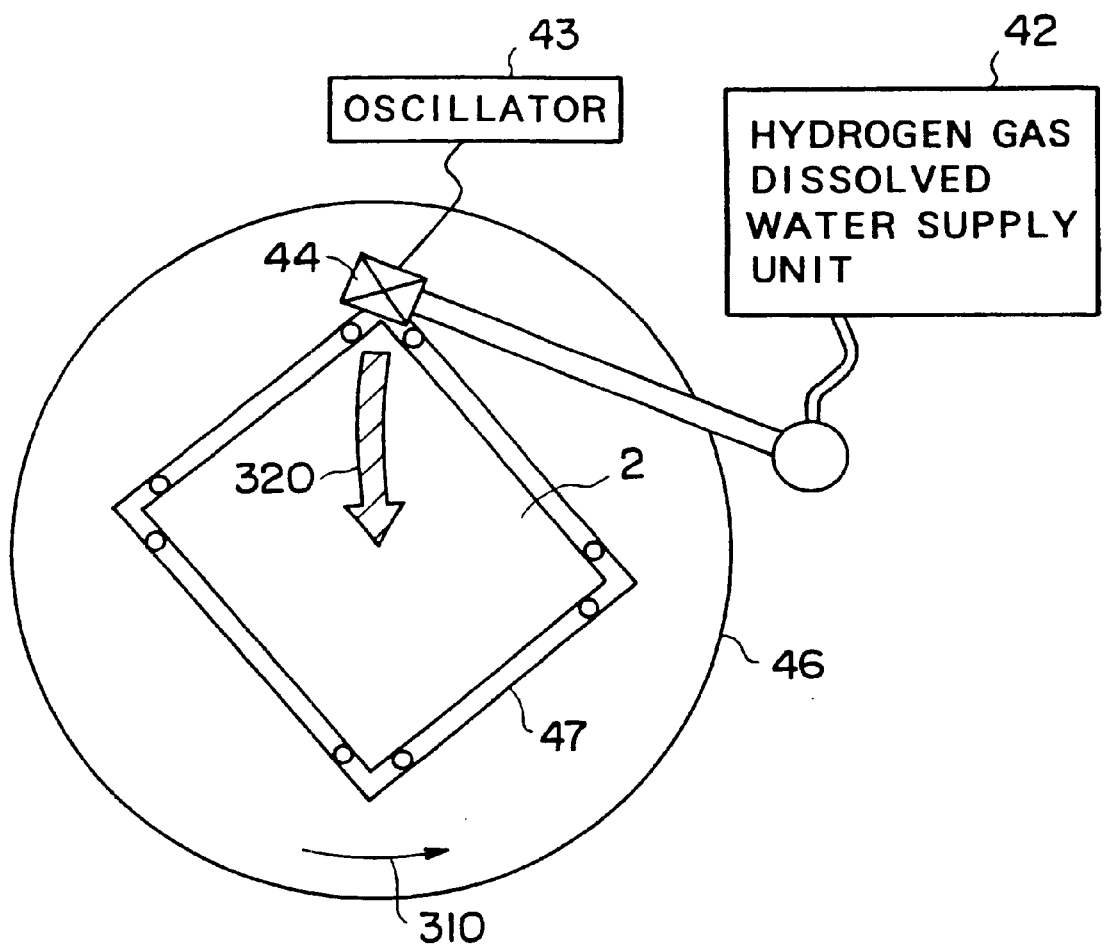
FIG. 10 is a schematic view for explaining a step of ultrasonic cleaning a substrate, on which an alignment layer has been formed, according to the present invention.
Figure 11:
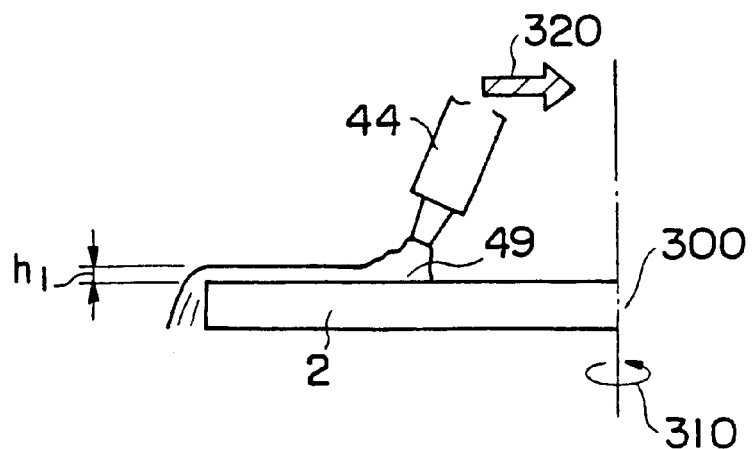
FIG. 11 is a schematic view for explaining the advantages of a step of ultrasonic cleaning a substrate, on which an alignment layer has been formed, according to the present invention.
Figure 12:
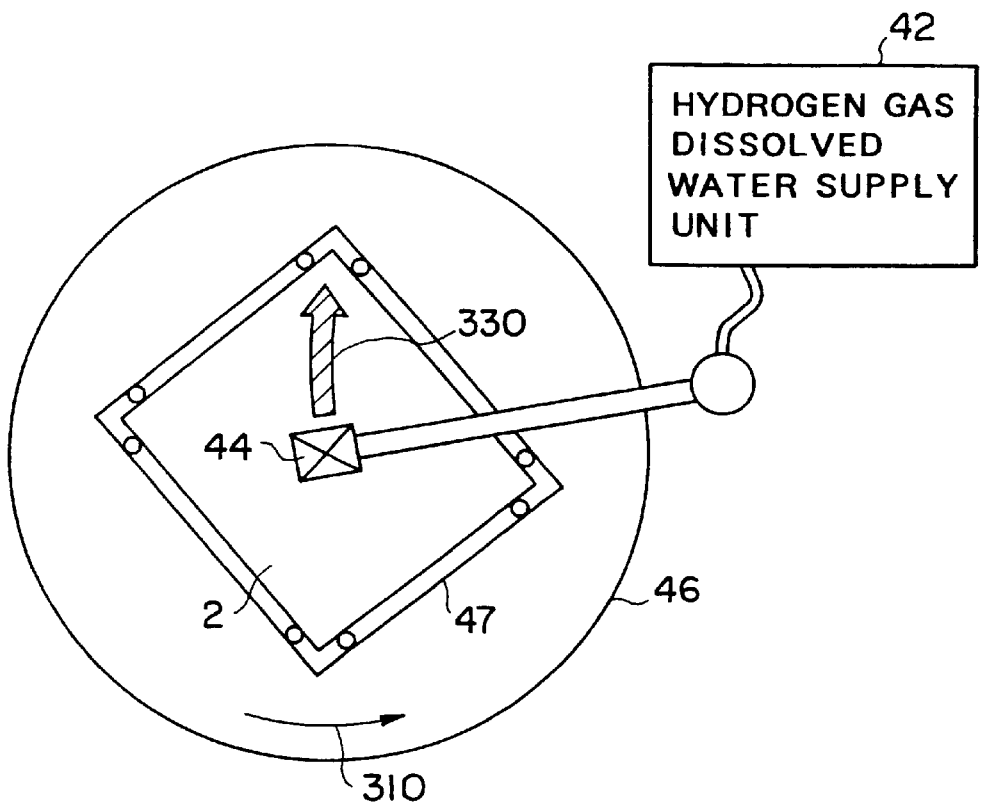
FIG. 12 is a schematic view showing a bad example of a step of ultrasonic cleaning a substrate, on which an alignment layer has been formed.

FIG. 10 is a top view of the spin cup unit of FIG. 3, and FIG. 11 is a half sectional view of the substrate 2 mounted on the spin cut unit of FIG. 10. FIG. 12 is a top view of the spin cup unit of FIG. 3, and FIG. 13 is a half sectional view of the substrate 2 mounted on the spin cup unit of FIG. 12.

The substrate 2 is mounted on a spin table 47 in a spin cup 46 to by means of a loader (not shown) to be fixed thereto (see FIG. 3). The spin table 47 is rotated by a motor 48 (see FIG. 3), so that the substrate 2 fixed to the spin table 47 is also rotated. At this time, it is assumed that the rotating direction is the direction of arrow 310 shown in FIG. 10. On the upper surface of the rotating substrate 2, a hydrogen gas dissolved water 49, to which an ultrasonic energy has been applied, is sprayed from an ultrasonic nozzle 44 (see FIG. 11). When the hydrogen gas dissolved water 49 is supplied from a hydrogen gas dissolved water supply unit 42 to the ultrasonic nozzle 44 and when the ultrasonic nozzle 44 is driven by means of an oscillator 43, the ultrasonic energy is applied to the hydrogen gas dissolve water.

At this time, as shown in FIGS. 10 and 11, the ultrasonic nozzle 44 is moved from the circumference of the substrate 2 to the rotation center 300 thereof in a radial direction of gyration (in the direction of arrow 320) along the surface of the substrate 2. Thus, as shown in FIG. 11, since the height $h_1$ of the hydrogen gas dissolved water 49 is substantially even, the ultrasonic energy is also uniformly transmitted, so that the surface of the substrate can be uniformly cleaned without unevenness. Therefore, it is possible to prevent the alignment restraining force of the alignment layer formed on the substrate from changing, so that it is possible to reduce bad alignment. Thus, it is possible to obtain a liquid crystal display having a high quality of screen.

Figure 13:
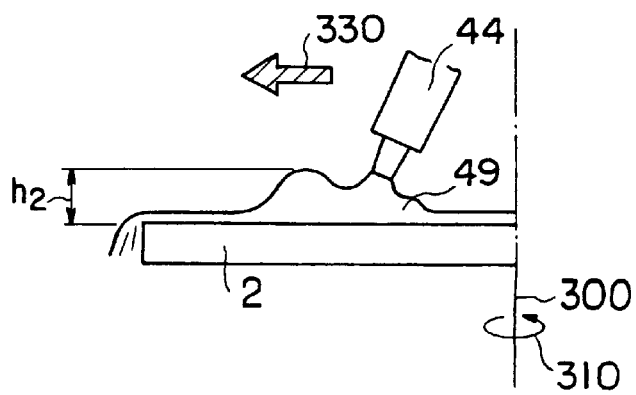
FIG. 13 is a schematic view showing a bad example of a step of ultrasonic cleaning a substrate, on which an alignment layer has been formed.

On the other hand, as shown in FIGS. 12 and 13, when the ultrasonic cleaning is carried out, if the ultrasonic nozzle 44 is moved from the rotation center 300 of the substrate to the circumference thereof in a radial direction of gyration (in the direction of arrow 330) along the surface of the substrate 2, the hydrogen gas dissolved water, to which the ultrasonic energy has been applied, is spread outwards in a whirl from the rotation center 300 of the substrate, so that the height $h_2$ of the hydrogen gas dissolved water 49 is uneven. Therefore, the transmission of the ultrasonic energy is uneven, so that the cleaning effect is uneven. When the cleaning effect is uneven, there is a problem in that the alignment restraining force changes at a certain specific point, so that the alignment state of the alignment film changes to cause visible defect.

Therefore, when the substrate, on which the alignment layer has been formed, is ultrasonic cleaned by means of the spin cup unit, the ultrasonic nozzle 44 is preferably moved from the circumference of the substrate 2 to the rotation center in a radial direction of gyration.

When the ultrasonic cleaning step is completed, the supply of the hydrogen gas dissolved water is stopped, and a pure water is sprayed on the rotating substrate 2 from the nozzle 45 to rinse the substrate 2. Thereafter, the supply of the pure water is stopped, and the spin table 47 is rotated at a high speed to drain the substrate 2. After the draining is completed, the substrate 2 is removed from the spin cup unit 41 to be transported to a hot plate (not shown) to be dried thereon.

In this preferred embodiment, while the hydrogen gas dissolved water used at the ultrasonic cleaning step F8 has been the same hydrogen gas dissolved water as that used at the brush cleaning step, i.e., the hydrogen gas dissolved water having the same ORP value as that used at the brush cleaning step, the hydrogen gas dissolved water used at the ultrasonic cleaning step may have an ORP different from that used at the brush cleaning step.

It was found that when the substrate, on which the alignment layer has been formed, was cleaned with the hydrogen gas dissolved water as this preferred embodiment, the residual rate of particles on the surface of the substrate was smaller than that in the conventional method using surface active agents. That is, it is possible to obtain a good detergency in comparison with the conventional method.

The array and color filter substrates thus formed are arranged so that the alignment layers face each other at an interval, and a liquid crystal composition is sandwiched between the substrates to complete a liquid crystal display.

Figure 4:
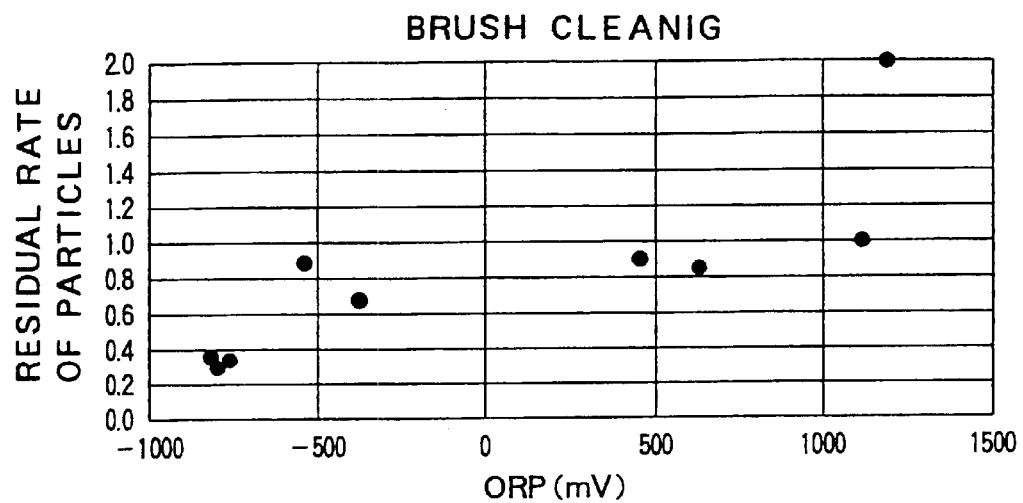
FIG. 4 is a graph showing the results of the measured residual rates of particles on the surface of a substrate before forming an alignment layer thereon, when the substrate is brush cleaned with hydrogen gas dissolved waters of various ORP values.

FIG. 4 shows the results of the measured residual rates of particles on the surface of a substrate before forming an alignment layer thereon (a substrate on which an electrode has been formed), when the brush cleaning and rinsing of the substrate were carried out using hydrogen gas dissolved waters of various ORP values. It is assumed in FIG. 4 that the residual rate of particles is 1 when the brush cleaning and rinsing are carried out using surface active agents as conventional methods. It can be seen from the results of experiment shown in FIG. 4 that it is possible to obtain a good detergency, which is the same as or better than those in conventional methods, when the ORP value is in the range of from −860 mV to 1100 mV. When the ORP value is in the range of from −860 mV to −400 mV, it is possible to further improve the detergency in comparison with conventional methods.

When a substrate before forming an alignment layer thereon, i.e., an array substrate on which a pixel electrode of ITO has been formed, or a counter substrate on which a counter electrode of ITO has been formed, is brush cleaned with a hydrogen gas dissolved water, the oxidation-reduction potential of the hydrogen gas dissolved water is preferably in the range of from −860 mV to −400 mV, more preferably in the range of from −860 mV to −750 mV, and the pH thereof is preferably in the range of from 8 to 12. The pH is equal to or higher than 8 in order to prevent metal particles from being adhered to a substrate again after removing contaminations of metal particles from the substrate by the brush cleaning, and the pH is equal to or less than 12 in order to prevent a metal electrode from melting.

Figure 5:
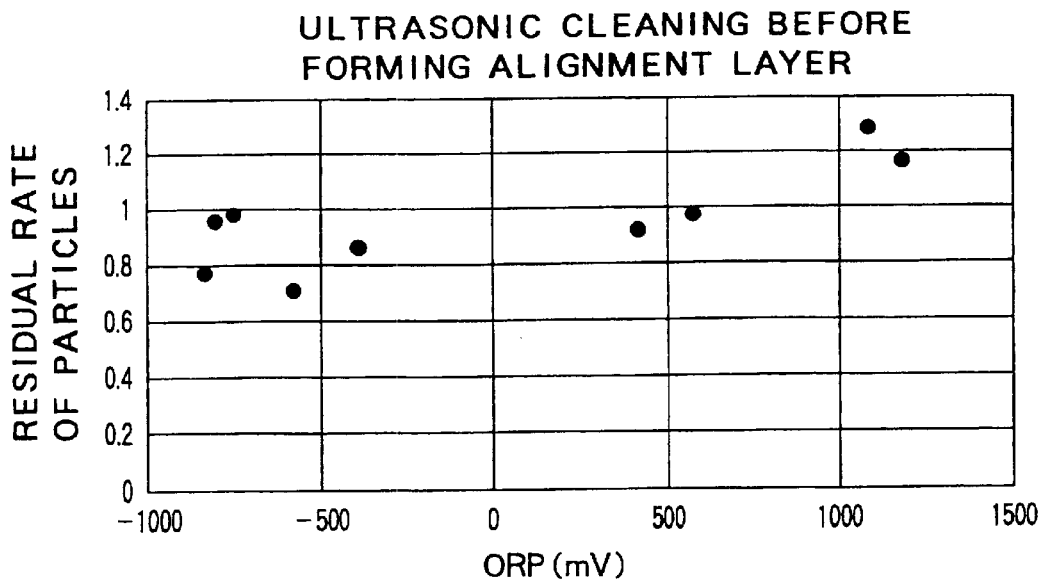
FIG. 5 is a graph showing the results of the measured residual rates of particles on the surface of a substrate before forming an alignment layer thereon, when the substrate is ultrasonic cleaned with hydrogen gas dissolved waters of various ORP values.

FIG. 5 shows the results of the measured residual rates of particles on the surface of a substrate before forming an alignment layer thereon (a substrate on which no electrode has been formed), when the ultrasonic cleaning and rinsing of the substrate were carried out using hydrogen gas dissolved waters of various ORP values. It is assumed in FIG.

5 that the residual rate of particles is 1 when the brush cleaning and rinsing are carried out using surface active agents as conventional methods. It can be seen from the results of experiment shown in FIG. 5 that it is possible to obtain a good detergency, which is the same as or better than those in conventional methods, when the ORP value of the hydrogen gas dissolved water is in the range of from −860 mV to 600 mV. When the ORP value of the hydrogen gas dissolved water is in the range of from −860 mV to −600 mV, it is possible to further improve the detergency in comparison with conventional methods.

Figure 6:
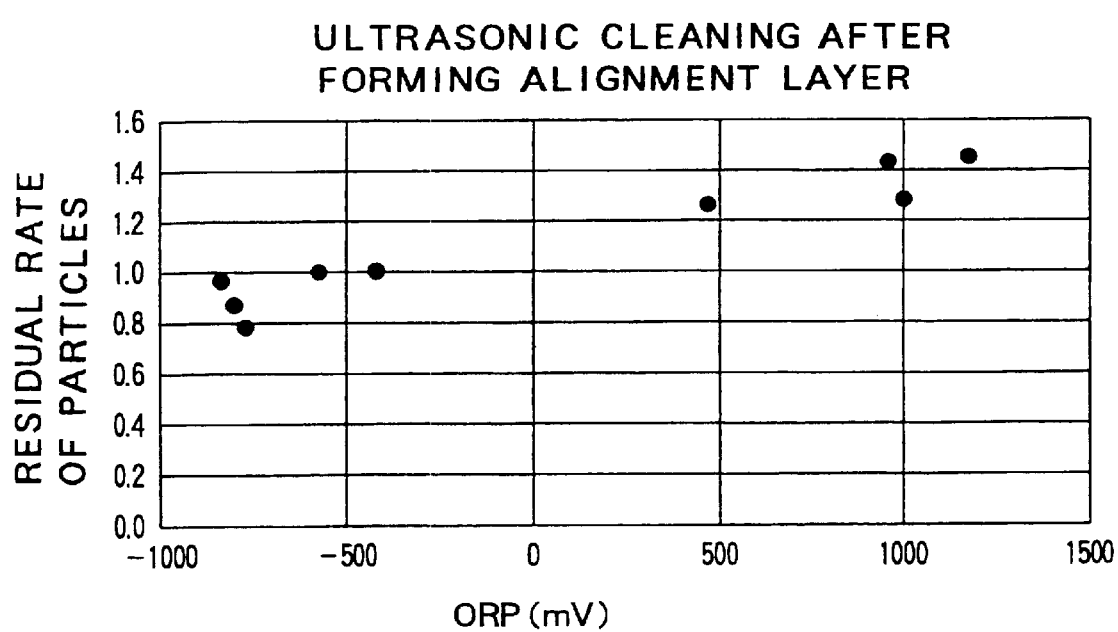
FIG. 6 is a graph showing the results of the measured residual rates of particles on the surface of a substrate after forming an alignment layer thereon, when the substrate is ultrasonic cleaned with hydrogen gas dissolved waters of various ORP values.

FIG. 6 shows the results of the measured residual rates of particles on the surface of a substrate after forming an alignment layer thereon (after rubbing the substrate), when the ultrasonic cleaning and rinsing of the substrate were carried out using hydrogen gas dissolved waters of various ORP values. In this case, the alignment layer was an organic film of a polyimide or the like. It is assumed in FIG. 6 that the residual rate of particles is 1 when the brush cleaning and rinsing are carried out using surface active agents as conventional methods. It can be seen from the results of experiment shown in FIG. 6 that it is possible to obtain a good detergency, which is the same as or better than those in conventional methods, when the ORP value of the hydrogen gas dissolved water is in the range of from −860 mV to −600 mV and when the pH thereof is in the range of from 8 to 12.

Furthermore, when the ORP value of a hydrogen gas dissolved water is in the range of from −860 mV to −600 mV, preferably in the range of from −860 mV to −780 mV, and when the pH thereof is in the range of from 10 to 11, this hydrogen gas dissolved water can be commonly used for the cleaning steps before and after an alignment layer is formed. In this case, it is possible to avoid waste that the hydrogen gas dissolved waters used at the respective cleaning steps are separately produced.

In addition, if the ultrasonic cleaning is carried out using the hydrogen gas dissolved water, it is possible to suitably remove foreign matters, such as contaminations, which are adhered to the surface of the alignment layer by the static electricity produced by the rubbing, without damaging the alignment layer.

When the ultrasonic cleaning is carried out using the hydrogen gas dissolved water, the concentration of the dissolved hydrogen has a great influence on the cleaning effect, and the details thereof will be described later. In the ultrasonic cleaning after forming the alignment layer, the pH is preferably in the range of from 7 to 12, preferably 8 to 11, and this will be described in detail later.

As described above, according to this preferred embodiment, if the ORP value of the hydrogen gas dissolved water is suitably set, it is possible to obtain a good detergency, which is the same as or better than those in conventional method using surface active agents.

When the hydrogen gas dissolved water is used as this preferred embodiment, the waste waters at the respective steps can be treated as non-industrial waters without the need of any special treatments, unlike the conventional methods using surface active agents, so that it is possible to decrease the manufacturing costs. In addition, at the rinsing step in this preferred embodiment, the rinsing performance is better than those in the conventional methods using surface active agents, so that it is possible to carry out the rinsing with a smaller amount of pure water and in a shorter time. Therefore, it is possible to inhibit the manufacturing costs from increasing.

In the above preferred embodiment, while both of the brush cleaning and ultrasonic cleaning have been carried out before forming the alignment layer, only one of the cleanings may be carried out.

Figure 7:
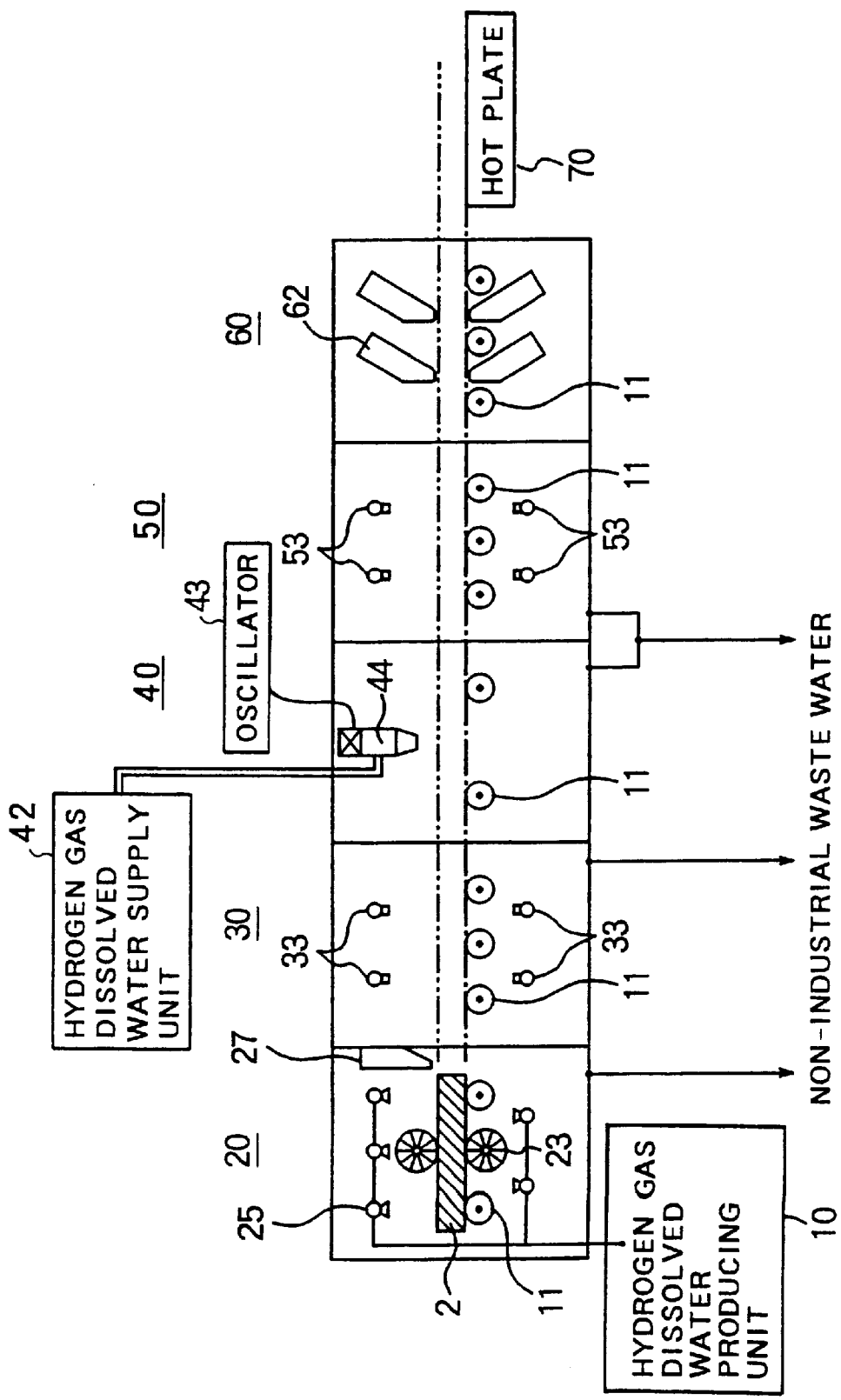
FIG. 7 is a schematic view for explaining a cleaning process in the second preferred embodiment of a method for producing a liquid crystal display according to the present invention.
Figure 8:
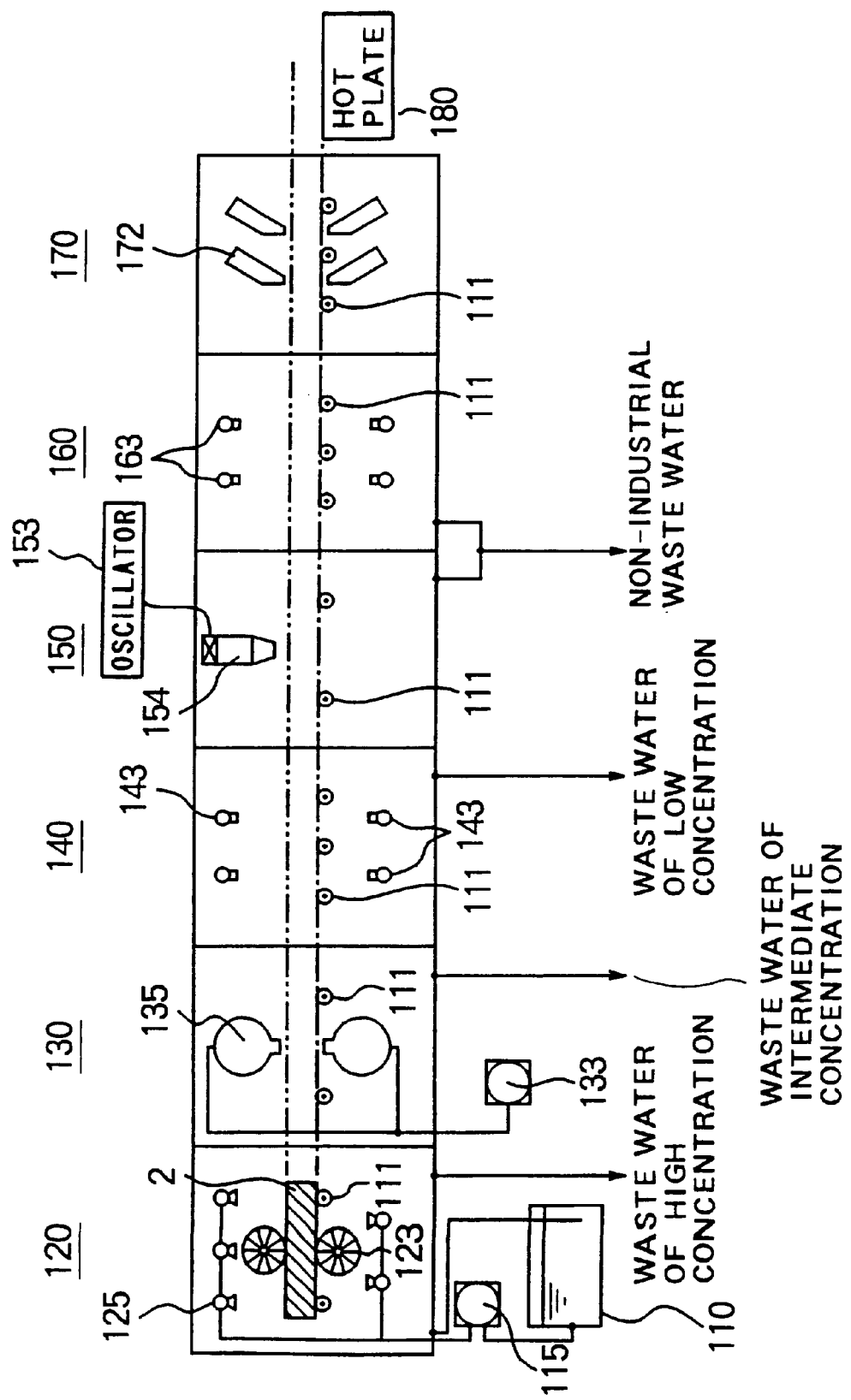
FIG. 8 is a schematic view for explaining a conventional cleaning process before an alignment layer is formed.
Figure 9:
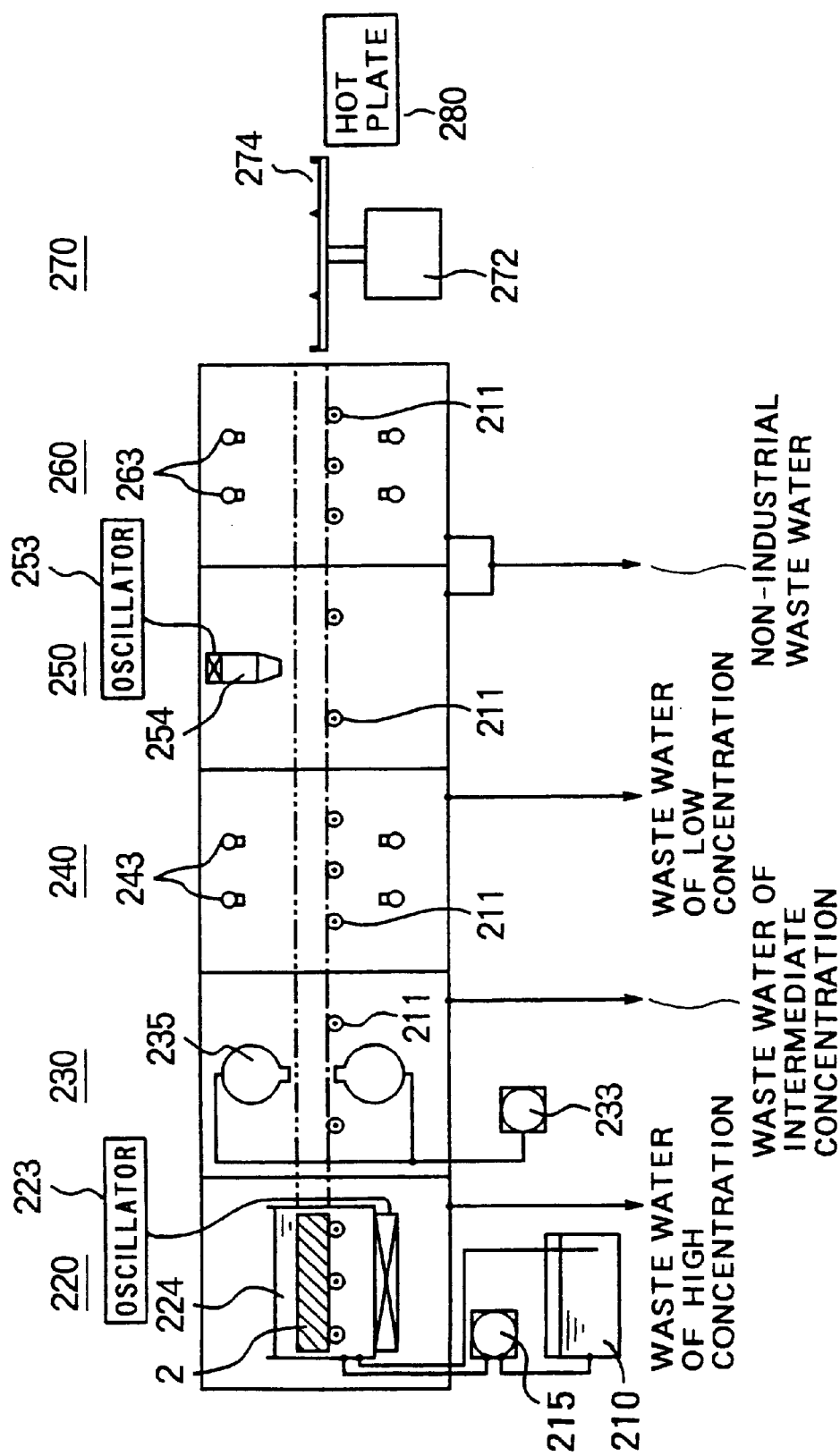
FIG. 9 is a schematic view for explaining a conventional cleaning process after an alignment layer is formed.

Referring to FIG. 7, the second preferred embodiment of a method for producing a liquid crystal display according to the present invention will be described below.

In the producing method of the second preferred embodiment, an ultrasonic cleaning step before forming an alignment layer is carried out without the need of a spin cup unit, and the brush cleaning and rinsing are carried out in the same manner as that in the first preferred embodiment shown in FIG. 2.

Similar to the first preferred embodiment, a substrate 2 is brush cleaned in a brush cleaning unit 20, and thereafter, the rinsing thereof is carried out in a shower unit 30 (see FIG. 7). After the rinsing, the substrate 2 is transported to an ultrasonic cleaning unit 40 by means of transfer rollers 11 to be ultrasonic cleaned therein. Thereafter, the substrate 2 is transferred to a shower unit 50 by means of transfer rollers 11 to be rinsed therein. After the rinsing, the substrate 2 is transferred to a draining unit 60 by means of transfer rollers 11 to be drained therein by means of air knives 62. Thereafter, the substrate 2 is transported to a hot plate 70 to be dried thereon.

This second preferred embodiment has the same advantages as those of the first preferred embodiment.

While ammonia has been used as a supporting electrolyte in the production of a hydrogen gas dissolved water in the above preferred embodiment, other materials (e.g., silicon) may be used if the materials have a small influence on electronic devices and on environment.

Figure 14:
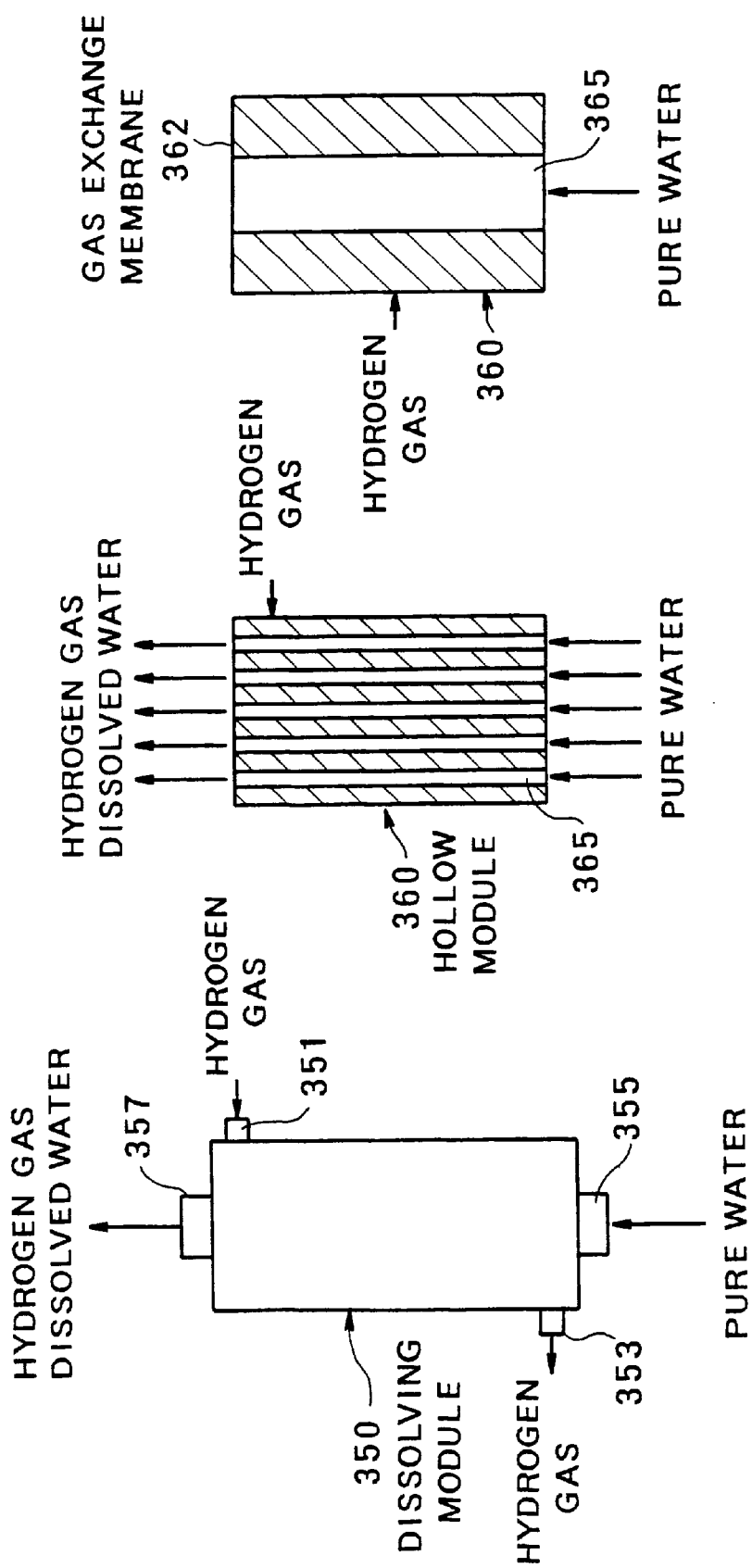
FIGS. 14A through 14C are schematic views for explaining a gas dissolving method for producing a hydrogen gas dissolved water.

Referring to FIGS. 14A through 14C, a gas dissolving method for producing a hydrogen gas dissolved waters will be described below.

As shown in FIG. 14A, in this gas dissolving method, a pure water is supplied to an inlet portion 355 provided on one end of a dissolving module 350, to which hydrogen gas is supplied via a gas inlet 351 and from which the hydrogen gas is discharged via a gas outlet 353, to dissolve the hydrogen gas in the pure water in the dissolving module to produce a hydrogen gas dissolved water, and the hydrogen gas dissolved water is discharged from an outlet portion 357 provided on the other end of the dissolving module 350.

A hollow module 360 is provided in the dissolving module 350 (see FIG. 14B). The hollow module 360 is made of a material (a gas exchange membrane) 362, through which water is not able to pass and hydrogen gas is able to pass and which has a plurality of holes 365 for allowing water to pass therethrough (see FIG. 14B). When a pure water passes through the holes 365 of the hollow module 360, hydrogen gas dissolves in the pure water by means of the gas exchange membrane 362 (see FIG. 14C). Furthermore, FIG. 14C is an enlarged view of a part of FIG. 14B.

The relationship between the concentration of hydrogen gas and the cleaning effect when the ultrasonic cleaning is carried out using the hydrogen gas dissolved water will be described below.

Figure 15:
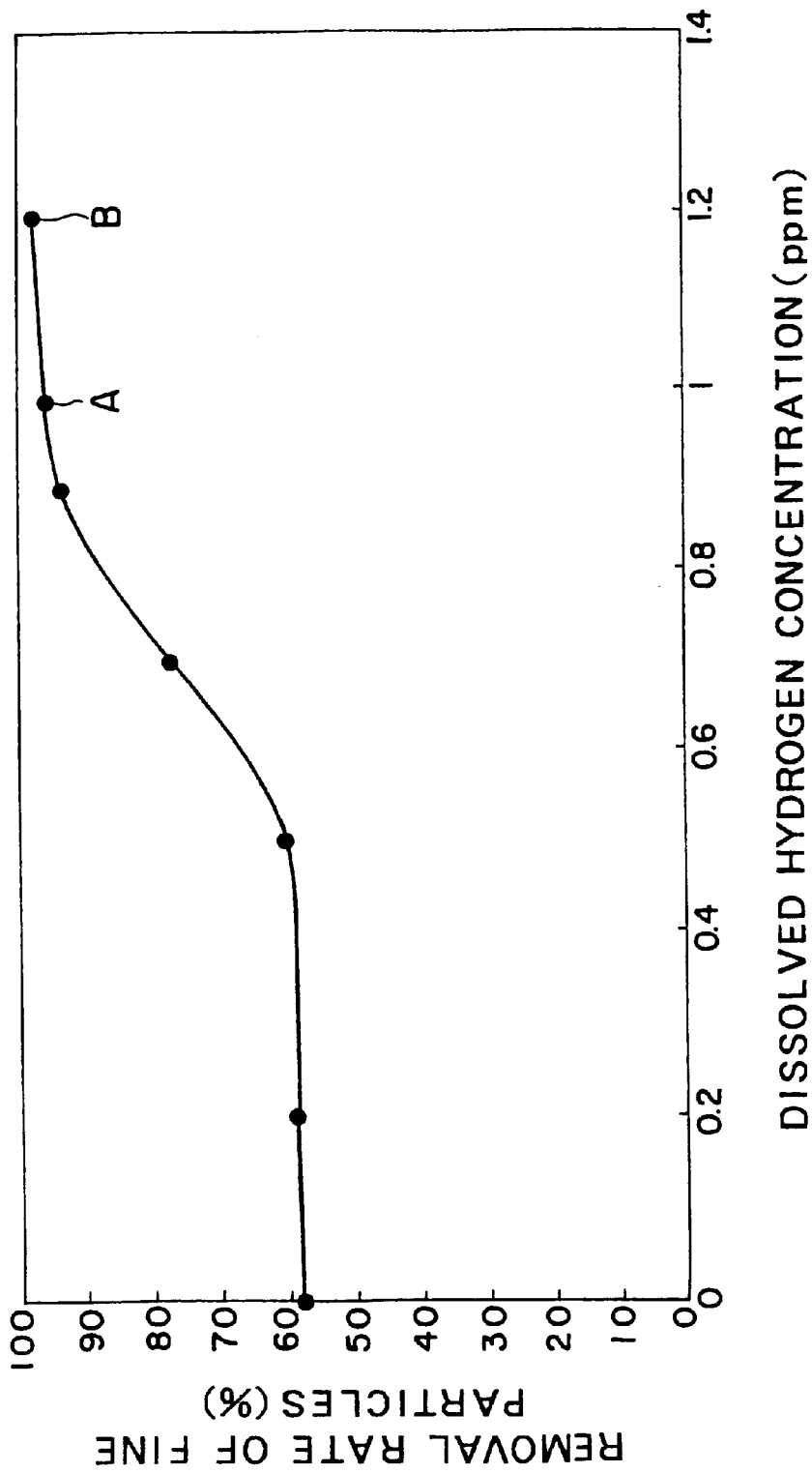
FIG. 15 is a graph showing the relationship between the concentration of dissolved hydrogen in a hydrogen gas dissolved water and the removal rate of fine particles.

FIG. 15 shows the relationship between the dissolved hydrogen concentration (ppm) in the hydrogen gas dissolved water and the removal rate (%) of fine particles when a Si wafer, which has been forced to be contaminated by $Al_2O_3$, is ultrasonic cleaned with a hydrogen gas dissolved water for 1 minute. Furthermore, the dissolved hydrogen concentration was measured by means of a dissolved hydrogen meter, and the detection of fine particles remaining on the Si wafer was carried out by detecting fine particles of not less than 1 $\mu$m by means of a wafer foreign-matter detector.

As can be seen from FIG. 15, when the dissolved hydrogen concentration is equal to or higher than 0.5 ppm, as the dissolved hydrogen concentration increases, the removal rate of fine particles rapidly increases, so that it is possible to obtain a good detergency. In particular, when the dissolved hydrogen concentration is equal to or higher than 0.9 ppm, the removal rate of fine particles exceeds 90%.

The hydrogen gas dissolved waters at points A and B in FIG. 15 are produced by the water electrolysis method and the gas dissolving method, respectively, and contain a $2 \times 10^3$ mol/liter of ammonia. FIG. 16 shows the characteristics of these hydrogen gas dissolved waters. In general, the dissolved hydrogen concentration in a hydrogen gas dissolved water produced by the gas dissolving method is higher than that in a hydrogen gas dissolved water (a cathode water) produced by the water electrolysis method.

Figure 17:
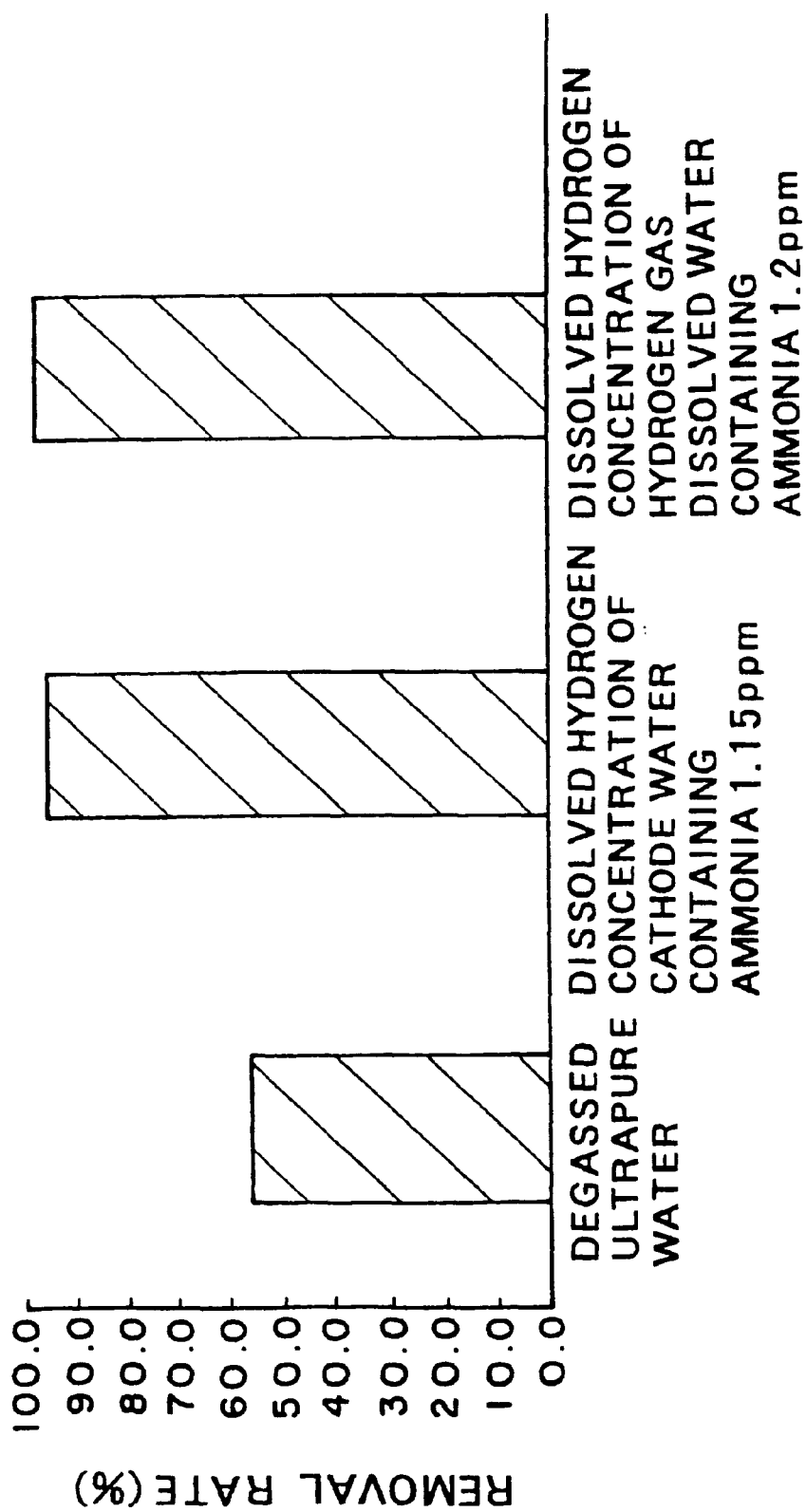
FIG. 17 is a graph showing the removal rates of particles when the ultrasonic cleanings are carried out using a degassed ultrapure water, a cathode water containing ammonia and a hydrogen gas dissolved water containing ammonia, respectively.

FIG. 17 shows the removal rates of particles when the ultrasonic cleaning of a Si wafer, which has been forced to be contaminated with $Al_2O_3$, is carried out for 1 minute using the hydrogen gas dissolved water produced by the gas dissolving method, the cathode water produced by the water electrolysis method and a degassed ultrapure water, respectively. It can be seen from FIG. 17 that when the hydrogen gas dissolved water is used for the ultrasonic cleaning, it is possible to obtain good cleaning effects in comparison with the cleaning using ultrapure water.

As described above, even if a hydrogen gas dissolved water having a dissolved hydrogen concentration of 0.5 to 2 ppm is used for a step of ultrasonic cleaning an electrode substrate of a liquid crystal display, it is possible to obtain good cleaning effects. In particular, an alkaline hydrogen dissolved water (e.g., pH=7 to 12, preferably 8 to 11) is preferably used to ultrasonic clean an electrode substrate, on which an alignment layer has been formed.

As described above, according to the present invention, it is possible to prevent the manufacturing costs from increasing without decreasing the detergency.

Figure 18:
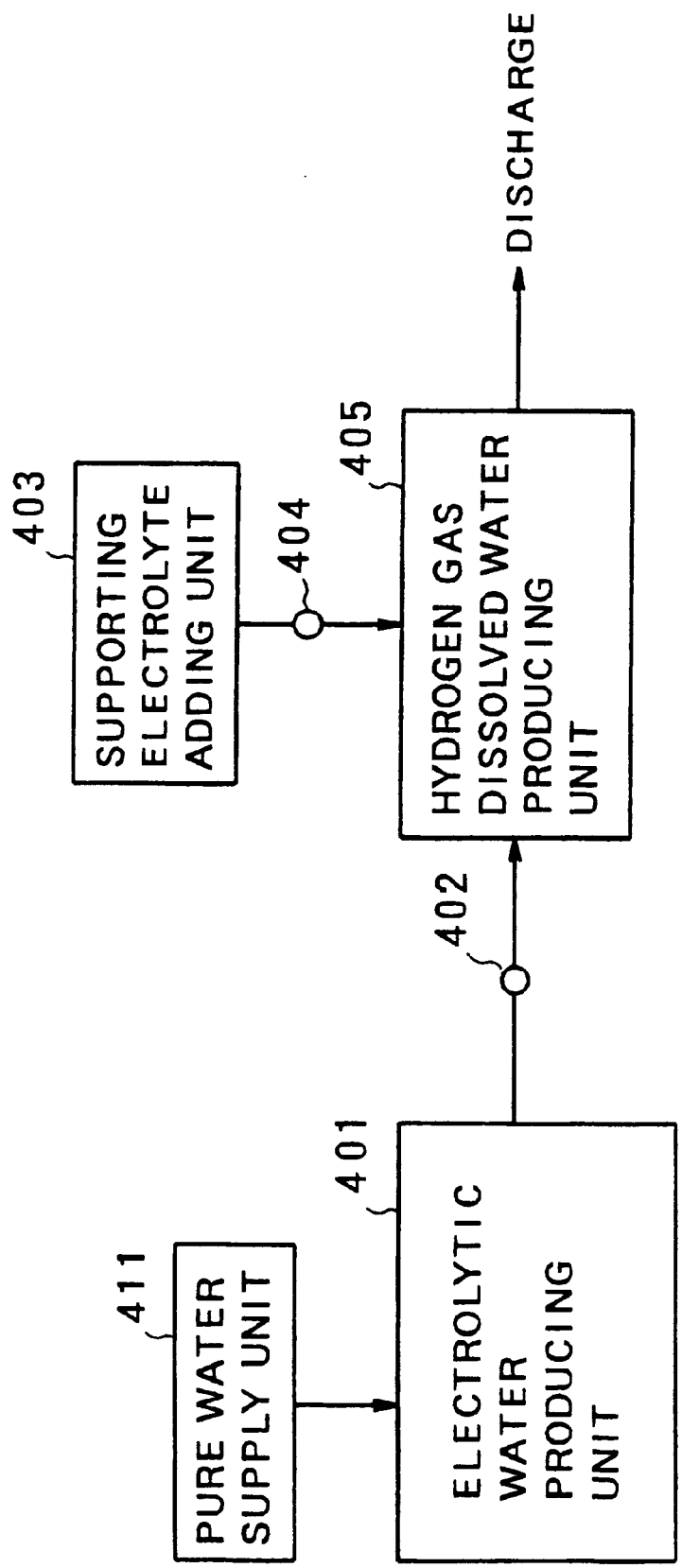
FIG. 18 is a schematic diagram for explaining a first embodiment of a method for producing a hydrogen gas dissolved water.

Referring to FIG. 18, a first embodiment of another method for producing a hydrogen gas dissolved water will be described below.

First, a degassed pure water is supplied from a pure water supply unit 411 serving as a pure water supply mechanism to an electrolytic water producing unit 401 serving as an electrolytic water producing mechanism. The electrolytic water producing unit 401 is an electrolyzing unit wherein the interior of an electrolyzing bath is divided by a porous ion exchange membrane into two regions, i.e., an anode chamber and a cathode chamber. A cathode is provided in the cathode chamber, and an anode is provided in the anode chamber. To the cathode and the anode, a dc voltage is applied via a control unit. The pure water supplied to the electrolytic water producing unit 401 is electrolyzed by applying a dc voltage between the cathode and the anode to produce electrolytic waters (a cathode water and an anode water).

The cathode water serving as an electrolytic water thus obtained is supplied to a hydrogen gas dissolved water producing unit 405 serving as a hydrogen gas dissolved water producing mechanism by opening a valve 402. After the valve 402 is closed, a supporting electrolyte $NH_4OH$ is added to the hydrogen gas dissolved water producing unit 405 from a supporting electrolyte adding unit 403 serving as a supporting electrolyte adding mechanism via an open valve 404, to obtain a hydrogen gas dissolved water having an $NH_4OH$ concentration of 0.2 to 1000 mmol/l. The supporting electrolyte should not be limited to $NH_4OH$, but it may be tetramethyl ammonium hydroxide or choline.

Figure 19:
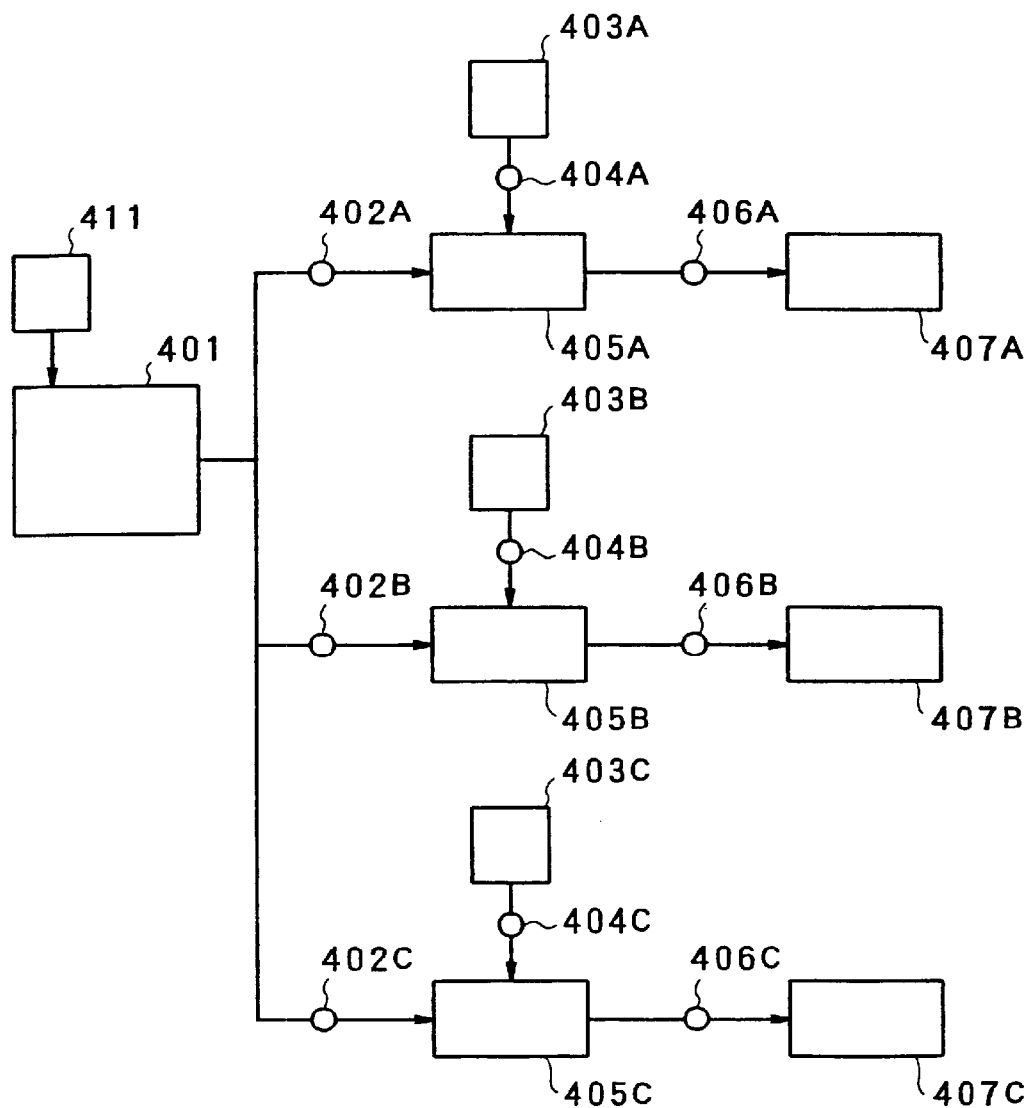
FIG. 19 is a schematic diagram for explaining a second embodiment of a method for producing a hydrogen gas dissolved water.

Referring to FIG. 19, a second embodiment of a method for producing a hydrogen gas dissolved water will be described below.

In this second embodiment, there is provided a method for producing a plurality of kinds of hydrogen gas dissolved waters, which have ORP values of −800 mV, −600 mV and −500 mV, respectively.

FIG. 19 is a schematic view of a unit for producing a plurality of kinds of hydrogen gas dissolved waters having different ORP values. A degassed pure water is supplied from a pure water supply unit 411 to an electrolytic water producing unit 401 serving as an electrolytic water producing mechanism. This electrolytic water producing unit 401 electrolytes the supplied pure water to produce a cathode water and an anode water. The produced cathode water is supplied to hydrogen gas dissolved water producing units 405A, 405B and 405C by opening valves 402A, 402B and 402C, respectively. The amount of the cathode water supplied to each of the hydrogen gas dissolved water producing units 405A, 405B and 405C is adjusted by adjusting the opening angle of each of the valves 402A, 402B and 402C. After the cathode water is supplied to the hydrogen gas dissolved water producing units 405A, 405B and 405C, the valves 402A, 402B and 402C are closed. Subsequently, valves 404A, 404B and 404C are open, so that a supporting electrolyte $NH_4OH$ is added to the hydrogen gas dissolved water producing units 405A, 405B and 405C from supporting electrolyte adding units 403A, 403B and 403C serving as supporting electrolyte adding mechanisms, respectively. The amount of each of the added supporting electrolytes is adjusted so that the ORP values of the hydrogen gas dissolved waters produced in the hydrogen gas dissolved water producing units 405A, 405B and 405C are −800 mV, −600 mV and −500 mV, respectively. Thereafter, the valves 404A, 404B and 404C are closed, and valves 406A, 406B and 406C are open, so that the hydrogen gas dissolved waters are supplied to cleaning baths 407A, 407B and 407C serving as cleaning mechanisms for cleaning objects to be cleaned, which are mounted thereon.

In this embodiment, the cleaning baths 407A, 407B and 407C correspond to the brush cleaning unit 20 at the step of cleaning the counter substrate (see FIG. 7), the ultrasonic cleaning unit 40 at the step of cleaning the counter substrate (see FIG. 7) and the ultrasonic cleaning unit after forming the alignment layer (see FIG. 3), respectively. While three kinds of hydrogen gas dissolved waters have been produced in this embodiment, the kinds of the produced hydrogen gas dissolved waters may be 2 or 4 or more.

As third, fourth and fifth embodiments, mechanisms for producing a plurality of kinds of hydrogen gas dissolved waters having different ORP values from an electrolytic water obtained by a single electrolyzing unit, which mechanisms are different from the second embodiment, will be described below.

Figure 20:
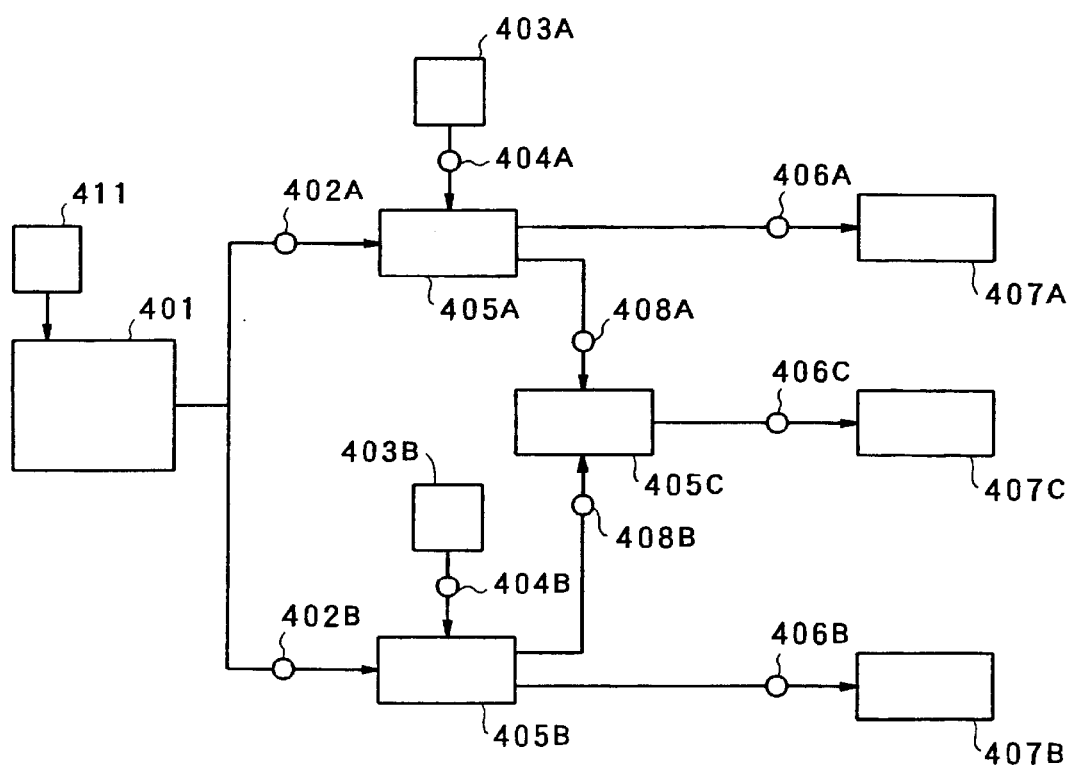
FIG. 20 is a schematic diagram for explaining a third embodiment of a method for producing a hydrogen gas dissolved water.

First, referring to FIG. 20, the third embodiment will be described.

A degassed pure water is supplied from a pure water supply unit 411 serving as a pure water supply mechanism to an electrolytic water producing unit 401 serving as an electrolytic water producing mechanism. The electrolytic water producing unit 401 electrolyzes the supplied water to produce a cathode water and an anode water. The produced cathode water is supplied to hydrogen gas dissolved water producing units 405A and 405B by opening valves 402A and 402B, respectively. The amount of the cathode water supplied to each of the hydrogen gas dissolved water producing units 405A and 405B can be adjusted by adjusting the opening angles of the valves 403A and 402B, respectively. After the cathode water is supplied to the hydrogen gas dissolved water producing units 405A and 405B, the valves 402A and 402B are closed. Subsequently, valves 404A and 404B are open, so that a supporting electrolyte $NH_4OH$ is added to the hydrogen gas dissolved water producing units 405A and 405B from supporting electrolyte adding units 403A and 403B serving as supporting electrolyte adding mechanisms, respectively. The amount of the added supporting electrolyte and the amount of the cathode water are adjusted, so that hydrogen gas dissolved waters having two different ORP values are produced in the hydrogen gas dissolved water producing units 405A and 405B. Then, valves 408A and 408B are open to supply and mix the cathode waters to a hydrogen gas dissolved water producing unit 405C, so that a hydrogen gas dissolved water having a third different ORP value is produced in the hydrogen gas dissolved water producing unit 405C. Then, similar to the second embodiment, the hydrogen gas dissolved waters are supplied to cleaning baths 407A, 407B and 407C from the hydrogen gas dissolved water producing units 405A, 405B and 405C via valves 406A, 406B and 406C, respectively.

In this embodiment, two kinds of hydrogen gas dissolved waters are mixed to produce an additional hydrogen gas dissolved water. The ORP value of the third kind of hydrogen gas dissolved water can be optionally changed by changing the mixing ratio of the two kinds of hydrogen gas dissolved waters, and four kinds of different hydrogen gas dissolved waters can be obtained from two kinds of hydrogen gas dissolved waters by increasing the number of the hydrogen gas dissolved water producing units.

Figure 21:
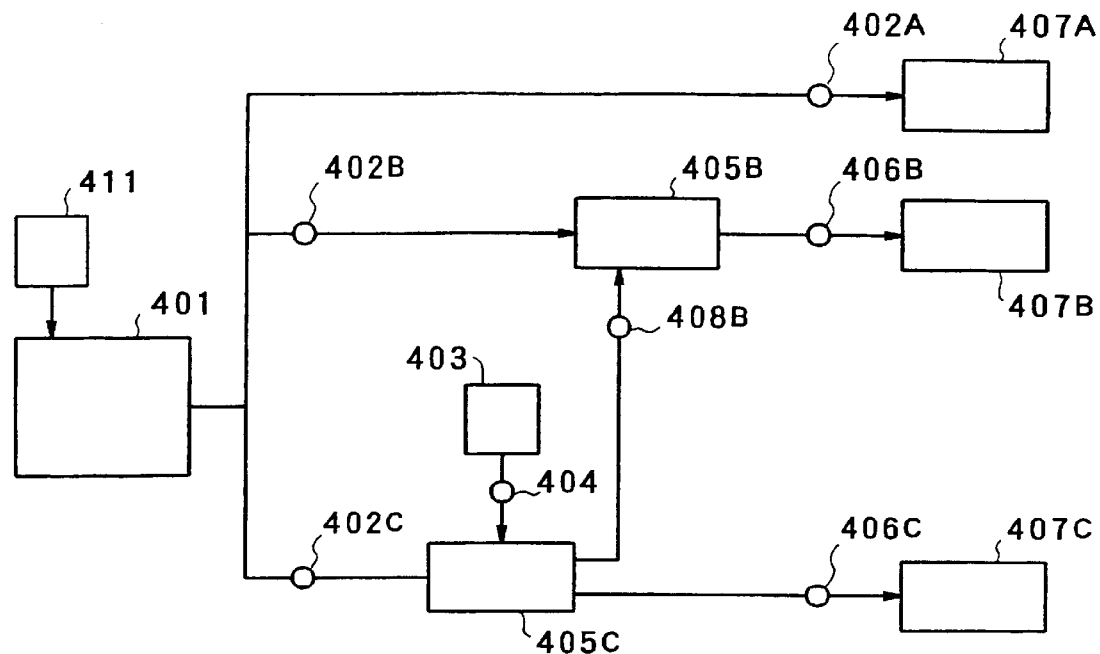
FIG. 21 is a schematic diagram for explaining a fourth embodiment of a method for producing a hydrogen gas dissolved water.

Referring to FIG. 21, the fourth embodiment will be described below.

This embodiment is the same as the third embodiment, except that a cathode water produced by a electrolytic water producing unit without adding a supporting electrolyte is directly supplied to a cleaning bath 406A, and that there is provided a hydrogen gas dissolved water producing unit 405B for mixing a hydrogen gas dissolved water produced in a hydrogen gas dissolved water producing unit 405C, to which a supporting electrolyte is supplied from a supporting electrolyte adding unit 403 by opening a valve 404, with a cathode water produced in an electrolytic water producing unit 401 without adding a supporting electrolyte to produce a hydrogen gas dissolved water.

Figure 22:
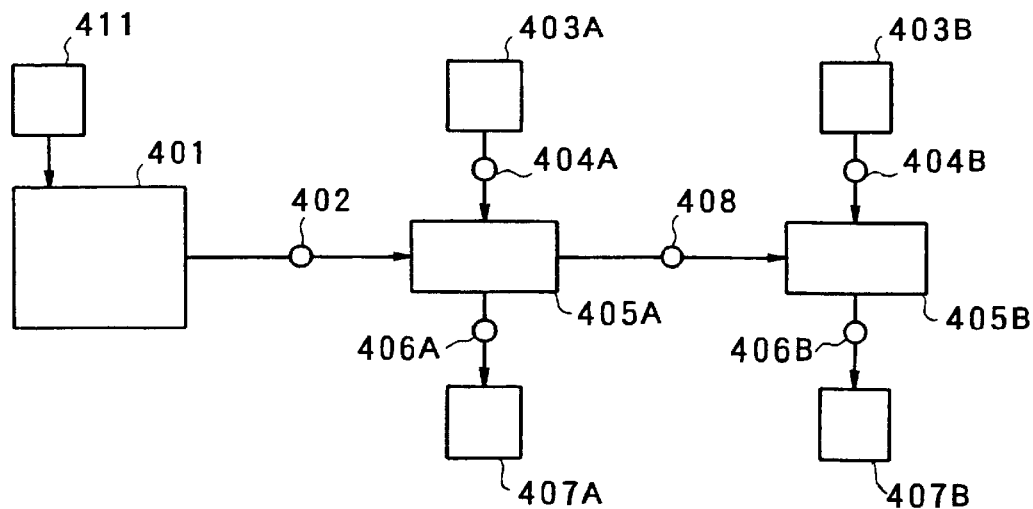
FIG. 22 is a schematic diagram for explaining a fifth embodiment of a method for producing a hydrogen gas dissolved water.

Referring to FIG. 22, the fifth embodiment will be described below.

A degassed pure water is supplied from a pure water supply unit 511 serving as a pure water supply mechanism to an electrolytic water producing unit 401 serving as an electrolytic water producing mechanism. The cathode water produced by electrolysis in the electrolytic water producing unit 401 is supplied to a hydrogen gas dissolved water producing unit 405A by opening a valve 402. After the cathode water is supplied to the hydrogen gas dissolved water producing unit 405A, the valve 402 is closed. Subsequently, a valve 404A is open, so that a supporting electrolyte $NH_4OH$ is added to the hydrogen gas dissolved water producing unit 405A from a supporting electrolyte adding unit 403A serving as a supporting electrolyte adding mechanism. The hydrogen gas dissolved water produced by the hydrogen gas dissolved water producing unit 405A is supplied to a cleaning bath 407A by opening a valve 406A. Subsequently, the valves 402, 404A and 406A are closed, and only a valve 408 is open, so that the hydrogen gas dissolved water produced by the hydrogen gas dissolved water producing unit 405A is supplied to a hydrogen gas dissolved water producing unit 405B. After the valve 408 is closed, a valve 404B is open, so that a supporting electrolyte $NH_4OH$ is added to the hydrogen gas dissolved water producing unit 405B from a supporting electrolyte adding unit 403B to produce a hydrogen gas dissolved water having an ORP value different from that of the hydrogen gas dissolved water produced by the hydrogen gas dissolved water producing unit 405A. Thus, hydrogen gas dissolved waters having different ORP values can be sequentially produced by means of a single pipe.

Thus, since a plurality of kinds of hydrogen gas dissolved waters having different ORP values can be produced from an electrolytic water produced by a single electrolytic water producing unit, it is sufficient to provide at least one electrolytic water producing unit, so that it is possible to sufficiently reduce the costs and to easily produce a hydrogen gas dissolved water having an optional ORP value.

While $NH_4OH$ has been used as a supporting electrolyte in the above embodiments, the present invention should not be limited thereto, but different supporting electrolytes suitable for the respective processes may be used to produce hydrogen gas dissolved waters by means of a single mechanism. For example, $NH_4OH$ may be added from the supporting electrolyte adding units 403A and 403B in FIG. 2, and tetramethyl ammonium hydroxide or choline may be added from the supporting electrolyte adding unit 403C in FIG. 2.

As described above, since a method for adding a supporting electrolyte after electrolyzing a pure water to produce a hydrogen gas dissolved water can be used to adjust the amount of the added supporting electrolyte to control the oxidation-reduction potential of the hydrogen gas dissolved water at a desired value, it is possible to easily produce a plurality of kinds of hydrogen gas dissolved waters having different oxidation-reduction potentials.

In addition, according to a method for adding a supporting electrolyte after electrolyzing a pure water to produce a hydrogen gas dissolved water, it is possible to inhibit the metal contamination from being mixed from electrodes and electrolyzing baths due to the presence of a supporting electrolyte, so that it is possible to obtain a hydrogen gas dissolved water having impurities of low concentration.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for producing a liquid crystal display having an electrode substrate, comprising the steps of:
    a step of providing an electrode substrate having active element parts, an organic resin disposed on said active element parts, and pixel electrodes disposed on said organic resin and connected with said active element parts via said organic resin;
    a first cleaning step of brush cleaning the electrode substrate with a first hydrogen gas dissolved water produced by a hydrogen gas being dissolved in purified water;
    a step of forming an alignment layer made of organic material on said electrode substrate; and a second cleaning step of ultrasonic cleaning said alignment layer formed on said electrode substrate with a second hydrogen gas dissolved water produced by a hydrogen gas being dissolved in purified water, wherein said first and second hydrogen gas dissolved water have a dissolved hydrogen gas concentration of not less than 0.5 PPM, and a pH of 7 to 12.

2. The method according to claim 1, wherein said organic resin constructs color filter, and said pixel electrode are made of ITO.

3. The method according to claim 1, wherein said hydrogen gas concentration is in the range of 0.5 PPM to 2 PPM.

4. The method according to claim 1, further comprising the step of rinsing said electrode substrate with purified water after the first cleaning step.

5. The method according to claim 1, wherein said first and second hydrogen gas dissolved water are the same material.

* * * * *